United States Patent

Banba et al.

[11] Patent Number: 5,877,985
[45] Date of Patent: Mar. 2, 1999

[54] INTERMEDIATE VOLTAGE GENERATING CIRCUIT AND NONVOLATILE SEMICONDUCTOR MEMORY HAVING THE SAME

[75] Inventors: Hironori Banba, Kamakura; Takeshi Miyaba, Yokohama, both of Japan

[73] Assignee: Kabushiki Kaisha Toshiba, Kawasaki, Japan

[21] Appl. No.: 881,061

[22] Filed: Jun. 24, 1997

[30] Foreign Application Priority Data

Jun. 24, 1996 [JP] Japan .................................. 8-162753

[51] Int. Cl.⁶ .................................................. G11C 16/06
[52] U.S. Cl. .............................. 365/185.21; 365/185.2; 365/189.09; 365/185.18; 365/207
[58] Field of Search ........................... 365/185.21, 185.2, 365/226, 189.09, 185.18, 207

[56] References Cited

U.S. PATENT DOCUMENTS 5,253,201  10/1993  Atsumi et al. .................. 365/185.21 X
5,673,232   9/1997  Furutami ........................ 365/189.09 X
5,689,460  11/1997  Ooishi ................................. 365/226 X

*Primary Examiner*—Huan Hoang
*Attorney, Agent, or Firm*—Banner & Witcoff, Ltd.

[57] ABSTRACT

A pull-up P-channel MOS transistor is connected between an output node and a VPP power supply terminal, while a pull-down N-channel MOS transistor is connected between the output node and a VSS power supply terminal. The output node has been electrically charged to VPP in an initial state. When a control signal SAEN has been made to be the "L" level, the change in the output node is gradually discharged. Since the output from the differential amplifying circuit is at the "H" level, the voltage at the output node is rapidly lowered. When the voltage at the output node has been made to be lower than a predetermined level, output voltage VOUT having a predetermined level is output.

51 Claims, 17 Drawing Sheets

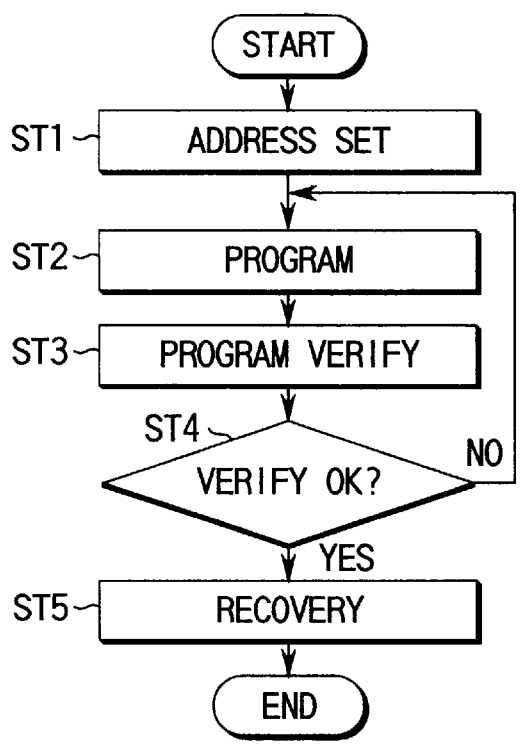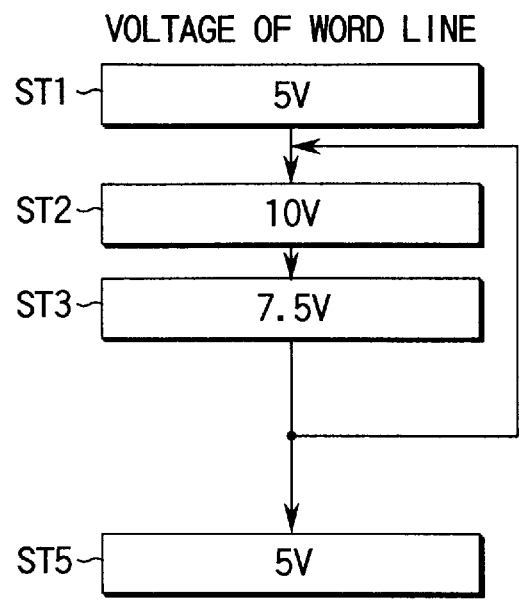
FIG. 1A
(PRIOR ART)
FIG. 1B
(PRIOR ART)
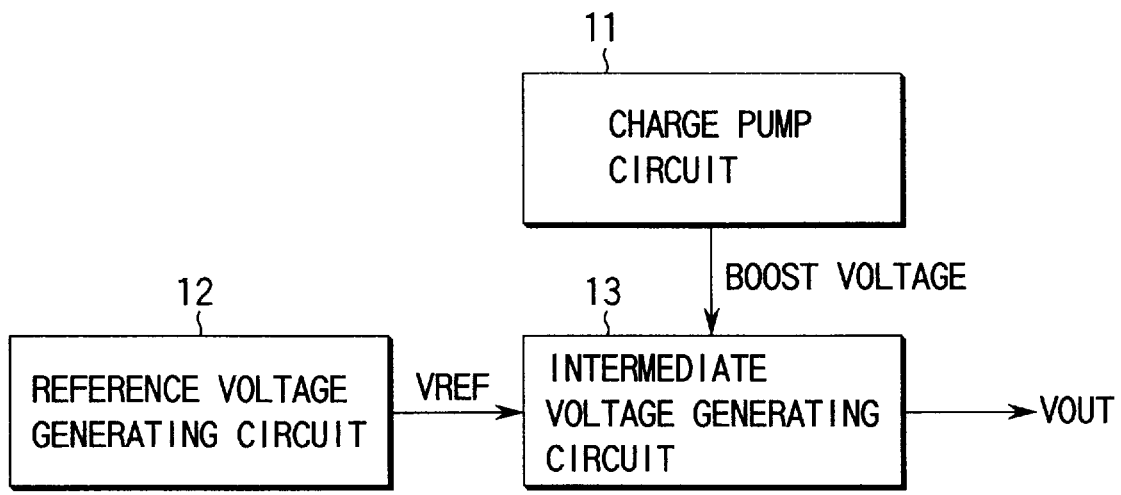
FIG. 2
(PRIOR ART)

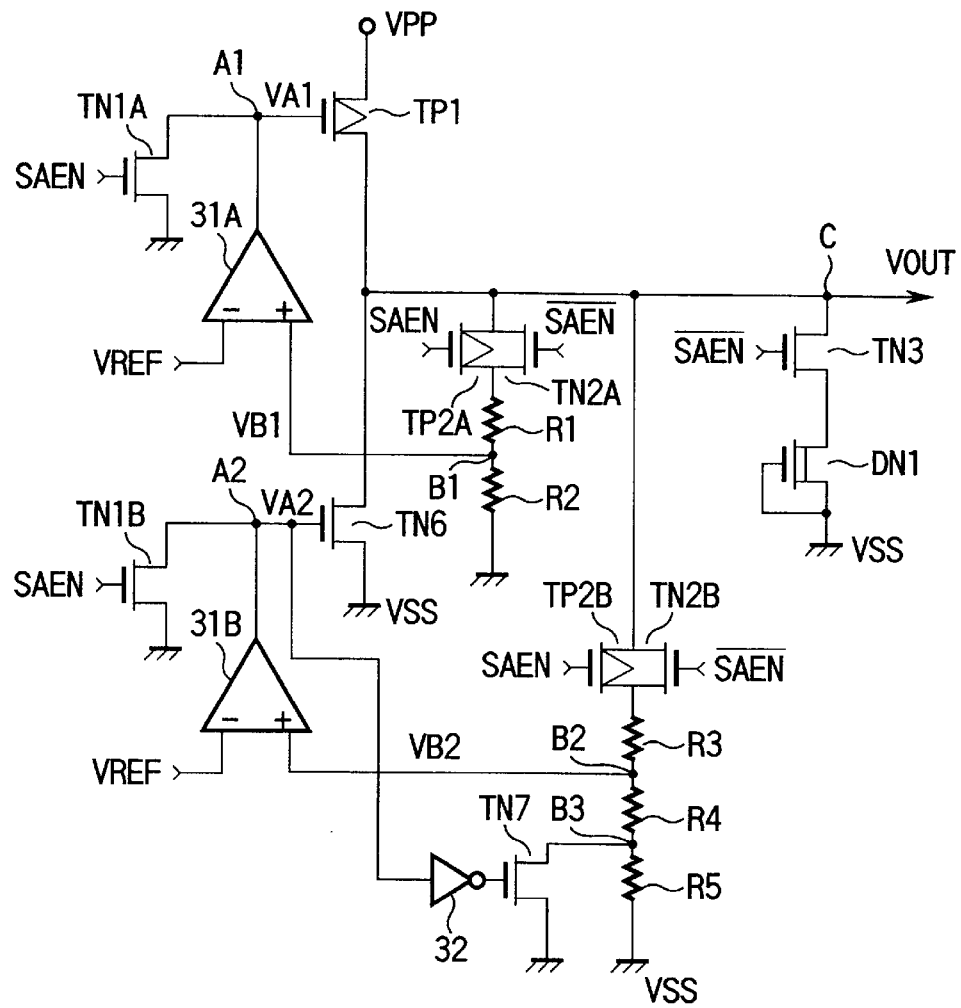
FIG. 8
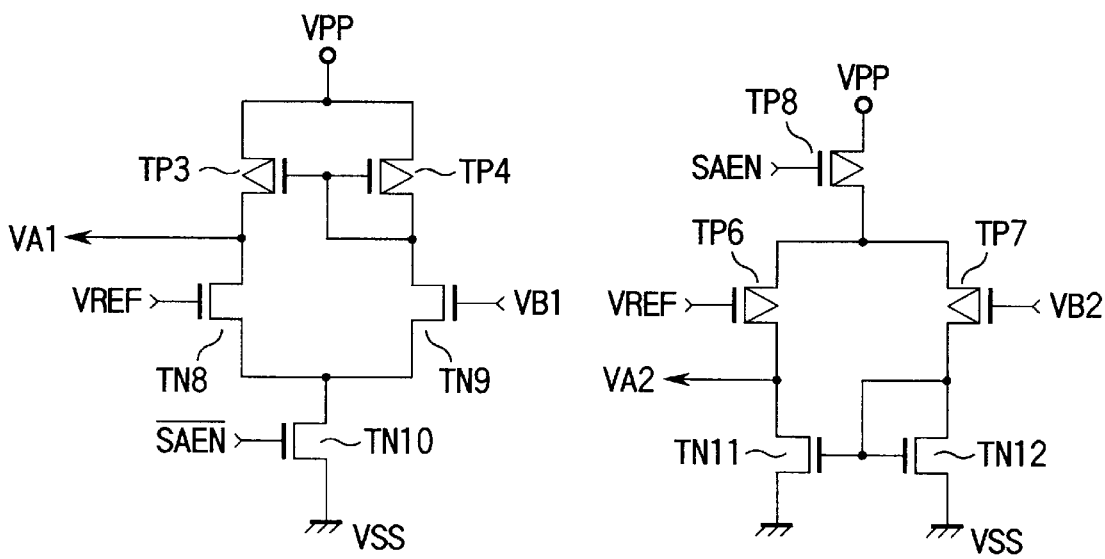
FIG. 9
FIG. 10

VDD3.3V±0.6V, VARIATION EQUAL TO OR LESS THAN 0.6%

INTERMEDIATE VOLTAGE GENERATING CIRCUIT AND NONVOLATILE SEMICONDUCTOR MEMORY HAVING THE SAME

BACKGROUND OF THE INVENTION

The present invention relates to an intermediate voltage generating circuit for supplying voltage having various levels to the gate and drain of a memory cell.

Hitherto, a nonvolatile semiconductor memory, such as an EPROM or EEPROM, requires voltage having various levels when it performs read, program, erase and verify operations, as shown in

TABLE 1

| MODE | GATE VOLTAGE Vg | DRAIN VOLTAGE Vd | SOURCE VOLTAGE Vs |
| --- | --- | --- | --- |
| READ | 5 V | 0.8 V | 0 V |
| PROGRAM | 10 V | 5 V | 0 V |
| ERASE | −10 V | 0 V | 5 V |
| VERIFY | 3.5 V, 5 V, 7.5 V | 0.8 V | 0 V |

For example, voltage Vg of a control gate of a memory cell is set to be 10 V when a program operation is performed, the same is set to be −10 V when an erase operation is performed, and the same is set to be 3.5 V, 5 V or 7.5 V when a verify operation is performed.

On the other hand, a nonvolatile semiconductor memory, such as a NOR flush memory developed recently, has been enabled to be operated with a single power source set to be 3.3 V in place of the conventional method using two power sources consisting of 5 V and 12 V power sources. If the single power source set to be 3.3 V is used, the various voltage levels shown in Table 1 are generated in a charge pump circuit in the LSI.

That is, the nonvolatile semiconductor memory using the single power source set to be 3.3 V is required to perform the program operation, the verify operation and so forth by quickly and accurately generating voltage having a predetermined level with respect to 3.3 V.

An automatic program mode will now be discussed as an example of a mode which must quickly switch the voltage.

FIGS. 1A and 1B are flow charts of the automatic program mode.

In the automatic program mode, the address is set initially, and then the program and verify operations are performed. If the verify operation has been performed successfully, the program operation is again performed. If the verify operation has been performed unsuccessfully, a recovery operation is performed to restore the original state.

At this time, for example, the voltage Vg of the word line is continuously changed as 5 V (when the address is set) →{10 V (when the program operation is performed)←→7.5 V (when the verify operation is performed): a predetermined number of times is repeated}→5 V (when the recovery operation is performed).

To perform the automatic program mode in a short time, the foregoing transition of the voltage levels must quickly be completed.

FIG. 2 shows a voltage generating system for generating voltage of various levels.

A charge pump circuit 11 generates boosted voltage VPP. A reference voltage generating circuit 12 generates reference voltage VREF. An intermediate voltage generating circuit 13 generates output voltage VOUT having various levels from the boosted voltage VPP with respect to the reference voltage VREF.

Hitherto, the reference voltage generating circuit 12 is classified into a zener diode type reference circuit, a widlar type BGR (Band Gap Reference Circuit), and the like.

FIG. 3 shows the zener diode type reference voltage generating circuit. The foregoing reference voltage generating circuit comprises a current source 14 and a zener diode 15. However, the reference voltage generating circuit required high voltage has a problem in that the voltage level required for the LSI cannot be lowered.

FIG. 4 shows the widlar BGR. The reference voltage generating circuit comprises bipolar transistors 16 to 19, resistors 20 to 22 and a current source 23. However, the foregoing reference voltage generating circuit having the bipolar transistors 16 to 19 encounters a difficulty in including a process for manufacturing the bipolar transistors in a process for manufacturing a MOS transistor. Thus, the foregoing reference voltage generating circuit has a problem in that it cannot widely be used. Although a parasitic bipolar transistor, which can be manufactured by the CMOS manufacturing process, may be employed, the characteristics of the parasitic bipolar transistor are changed excessively attributable to the density of the well to be employed practically.

FIG. 5 shows an example of the structure of the conventional intermediate voltage generating circuit.

Reference voltage VREF is supplied to a negative input terminal of a current mirror differential amplifying circuit 31. The gate of a pull-up P-channel MOS transistor TP1 is connected to an output terminal of the current mirror differential amplifying circuit 31. An N-channel MOS transistor TN1 is connected between the gate of the MOS transistor TP1 and the grounded point.

Boosted voltage VPP of the charge pump circuit is applied to the source of the MOS transistor TP1, while output voltage VOUT is output from the drain of the same. Resistors R1 and R2 and MOS transistors TP2 and TN2 connected in parallel to each other are, in series, connected between the drain of the MOS transistor TP1 and the grounded point.

Junction B between the resistors R1 and R2 is connected to the positive input terminal of the differential amplifying circuit 31.

An N-channel MOS transistor TN3 and a depression type N-channel MOS transistor DN1 are, in series, connected between the drain of the MOS transistor TP1 and the grounded point. The gate and source of the MOS transistor DN1 are connected to each other.

Control signal SEAN is supplied to the gate of each of the MOS transistors TN1 and TP2, while control signal $\overline{\text{SEAN}}$ is supplied to the gate of each of the MOS transistors TN2 and TN3.

In the intermediate voltage generating circuit having the above-mentioned structure, the current mirror differential amplifying circuit 31 detects and amplifies the difference between the reference voltage VREF and the voltage VB at the junction B. In accordance with the output from the differential amplifying circuit 31, the pull-up P-channel MOS transistor TP1 is driven so as to maintain the output voltage VOUT at a constant level.

The output voltage VOUT of the intermediate voltage generating circuit and the voltage VB at the junction B have the relationship expressed by the following Equation (1):

$$(R2 \times \text{VOUT})/(R1+R2)=B \quad (1)$$

where R1 and R2 are resistance levels of the resistors R1 and R2.

That is, when VB=VREF, the output voltage VOUT has a constant value. Even if the level of the boosted voltage VPP is deflected and thus the output voltage VOUT is somewhat varied, the amount of variation is fed back to the differential amplifying circuit 31. As a result, the output voltage VOUT can immediately be stabilized.

Rise of the output voltage VOUT occurring when a sub-threshold leak current in the pull-up P-channel MOS transistor TP1 is allowed to flow is prevented by the depression type N-channel MOS transistor DN1. The reason for this is that the depression type MOS transistor DN1 serves as a constant current source for allowing a constant current to flow such that it does not depend upon the boosted voltage VPP.

When the intermediate voltage generating circuit is not operated, the control signal SAEN is set to be the "H" level.

When the control signal SAEN is at the "H" level, the MOS transistor TN1 is turned on. On the other hand, the MOS transistors (the transfer gates) TP2 and TN2 and the MOS transistor TN3 are turned off. That is, output node A of the current mirror differential amplifying circuit 31 is made to be ground voltage VSS so that the MOS transistor TP1 is brought to a state where it is always operated. Since the MOS transistors TP2, TN2 and TN3 have been turned off, the output voltage VOUT is made to be the boosted voltage VPP.

When the intermediate voltage generating circuit is operated to obtain the predetermined output voltage VOUT, the control signal SAEN is required to be set to the "L" level.

When the control signal SAEN is made to be the "L" level, the MOS transistor TN1 is turned off and the MOS transistors (the transfer gates) TP2 and TN2 and the MOS transistor TN3 are turned on.

Since output node C has been electrically charged to the boosted voltage VPP at this time, an electric current flows from the output node C to the grounded point through the MOS transistors TP2 and TN2 and the resistors R1 and R2.

Since the voltage VB at the junction B is higher than the reference voltage VREF immediately after the control signal SAEN has been made to be the "L" level, the current mirror differential amplifying circuit 31 outputs voltage having the "H" level to retain the pull-up MOS transistor TP1 to be turned off.

Therefore, the charge in the output node C is gradually discharged. When the voltage VB at the junction B has been made to be the same as the reference voltage VREF, the intermediate voltage generating circuit outputs the constant output voltage VOUT.

However, the conventional intermediate voltage generating circuit mainly uses the passage which is allowed to pass through the resistors R1 and R2 to discharge the charge in the output node C.

That is, if the levels of the resistors R1 and R2 are raised to reduce electric power consumption, there arises a problem in that an excessively long time is required to realize the predetermined output voltage VOUT after the output node C has been electrically charged to the boosted voltage VPP.

If the levels of the resistors R1 and R2 are lowered to quickly obtain the predetermined output voltage VOUT, there arises a problem in that the electric current consumption is enlarged.

As described above, the conventional intermediate voltage generating circuit involves that the requirement for the reduction of the power consumption and the requirement for raise the operation speed have the trade-off relationship. Therefore, the two requirements cannot simultaneously be satisfied.

FIG. 6 shows another example of the structure of the conventional intermediate voltage generating circuit.

Reference voltage VREF is supplied to the negative input terminal of the current mirror differential amplifying circuit 31. The gate of a pull-up P-channel MOS transistor TP1 is connected to an output terminal of the current mirror differential amplifying circuit 31. The differential amplifying circuit 31 is controlled in response to enable signal ENA such that the differential amplifying circuit 31 is made to be operable when the enable signal ENA is "H" level.

Boosted voltage VPP of the charge pump circuit is applied to the source of the MOS transistor TP1, while output voltage VOUT is output from the drain of the same. Resistors R1 and R2 are, in series, connected between the drain of the MOS transistor TP1 and the grounded point. Junction B of the resistors R1 and R2 is connected to the positive input terminal of the differential amplifying circuit 31.

An N-channel MOS transistor TN4 is connected between the drain of the MOS transistor TP1 and the grounded point. The gate of the MOS transistor TN4 is supplied with inverted signal $\overline{ENA}$ of the enable signal.

An N-channel MOS transistor TN5 is connected between the drain of the MOS transistor TP1 and the grounded point. The MOS transistor TN5 has relatively small size to prevent rise of the output voltage VOUT occurring due to overshoot, sub-threshold leak current, charge coupling or the like.

A capacitor C1 is connected between the drain of the MOS transistor TP1 and the grounded point. The capacitor C1 is provided for the purpose of compensating phase delay for the feedback loop of the differential amplifying circuit 31 so as to stabilize the output voltage VOUT.

In the intermediate voltage generating circuit having the above-mentioned structure, the current mirror differential amplifying circuit 31 detects and amplifies the difference between the reference voltage VREF and the voltage VB at the junction B. In accordance with the output from the differential amplifying circuit 31, the pull-up P-channel MOS transistor TP1 is driven so that the output voltage VOUT is retained at a constant level.

The output voltage VOUT from the intermediate voltage generating circuit and the voltage VB at the junction B have the relationship expressed by the above-mentioned Equation (1).

That is, when VB=VREF, the output voltage VOUT has a constant value. Even if the level of the boosted voltage VPP is deflected and thus the output voltage VOUT is somewhat varied, the amount of variation is fed back to the current mirror differential amplifying circuit 31. Thus, the output voltage VOUT can immediately be stabilized.

Rise of the output voltage VOUT occurring due to overshoot, capacity coupling with the power source, the sub-threshold leak current of the pull-up P-channel MOS transistor TP1 or the like is prevented by the N-channel MOS transistor TN5 having the relatively small size. That is, the MOS transistor TN5 always lowers the level of the output voltage VOUT.

The differential amplifying circuit 31 has a current mirror circuit composed of a P-channel MOS transistor which has excellent consistency with the MOS transistor TP1 in order to drive the P-channel MOS transistor TP1. That is, the current mirror circuit of the differential amplifying circuit 31 is composed of a MOS transistor having the same conduction type as that of the MOS transistor which is driven by the differential amplifying circuit 31.

As a result, the cut off characteristics of the intermediate voltage generating circuit can be improved and an error occurring when the stable state has been realized can be prevented.

The capacitor C1 compensates phase delay for the feedback loop of the differential amplifying circuit 31 so as to stabilize the output voltage VOUT.

When the intermediate voltage generating circuit is not operated, the enable signal ENA must be set to be "L" level.

When the enable signal ENA is "L" level, the voltage level of the output node A of the differential amplifying circuit 31 is made to be the same as the power supply voltage VDD. Thus, the P-channel MOS transistor TP1 is turned off. Moreover, the N-channel MOS transistor TN4 having the gate to which the inverted signal $\overline{\text{ENA}}$ of the enable signal is supplied is turned on. Therefore, the output voltage VOUT is made to be the level of the ground voltage VSS.

When the intermediate voltage generating circuit is operated to obtain the predetermined output voltage VOUT, the enable signal ENA must be set to be "H" level.

When the enable signal ENA is made to be "H" level, the P-channel MOS transistor TP1 is turned on and the N-channel MOS transistor TN4 is turned off.

At this time, an electric current is supplied from the charge pump circuit to the output node C so that the voltage level of the output node C is made to be the constant output voltage VOUT.

However, the conventional intermediate voltage generating circuit having the above-mentioned structure, as shown in FIG. 7, has a problem in that the output voltage VOUT is oscillated and an excessively long time is required for the output voltage VOUT to be stabilized to a constant level.

As described above, the requirement for reducing the power consumption and that for raising the operation speed of the intermediate voltage generating circuit have not simultaneously been satisfied. Moreover, the output voltage cannot quickly be stabilized to a constant voltage level because of the oscillation of the output voltage.

BRIEF SUMMARY OF THE INVENTION

In view of the foregoing, an object of the present invention is to provide a nonvolatile semiconductor memory having an intermediate voltage generating circuit capable of simultaneously satisfying a requirement for raising the operation speed and a requirement for reducing electric power consumption. Another object of the present invention is to provide a nonvolatile semiconductor memory having an intermediate voltage generating circuit capable of preventing oscillation of the output voltage and quickly and stably outputting constant voltage.

In order to achieve the above-mentioned objects, an intermediate voltage generating circuit according to the present invention comprises: first voltage-dividing means for dividing output voltage from an output node at a predetermined ratio; a first differential amplifying circuit for receiving reference voltage and voltage divided by the first voltage-dividing means; second voltage-dividing means for dividing the output voltage from the output node at a predetermined ratio; a second differential amplifying circuit for receiving the reference voltage and voltage divided by the second voltage-dividing means; a first terminal which is applied with first voltage; a first MOS transistor having a source connected to the first terminal, a drain connected to the output node and a gate to which the output voltage from the first differential amplifying circuit is applied; a second terminal which is applied with second voltage; and a second MOS transistor having a source connected to the second terminal, a drain connected to the output node and a gate to which the output voltage from the second differential amplifying circuit is applied.

The intermediate voltage generating circuit according to the present invention further comprises: means for changing the ratio of division of the voltage which is performed by the second voltage-dividing means to inhibit the second MOS transistor to be again turned on after the output voltage from the second differential amplifying circuit has been supplied and thus the second MOS transistor has been turned off.

The intermediate voltage generating circuit according to the present invention further comprises means for turning the first MOS transistor on, turning the second MOS transistor off and deactivating the first voltage-dividing means and the second voltage-dividing means to set the output node to be the first voltage in a standby mode, and activating the first voltage-dividing means and the second voltage-dividing means and operating the first MOS transistor in accordance with the output voltage from the first differential amplifying circuit to operate the second MOS transistor in accordance with the output voltage from the second differential amplifying circuit when intermediate voltage is generated.

The intermediate voltage generating circuit according to the present invention further comprises means connected between the output node and the second terminal and arranged not to be operated in the standby mode and to be operated as a constant current source when intermediate voltage is generated.

When the first voltage is boosted voltage obtained by boosting the external power supply voltage, the second voltage is grounded voltage, the first MOS transistor is a P-channel MOS transistor and the second MOS transistor is an N-channel MOS transistor, the first differential amplifying circuit has a current mirror circuit composed of a P-channel MOS transistor and the second differential amplifying circuit has a current mirror circuit composed of an N-channel MOS transistor.

An intermediate voltage generating circuit according to the present invention comprises: voltage dividing means for dividing, into a plurality of levels, output voltage from an output node at a predetermined ratio; a first differential amplifying circuit for receiving reference voltage and one of voltage levels divided by the first voltage-dividing means; a second differential amplifying circuit for receiving the reference voltage and another voltage level divided by the second voltage-dividing means; a first terminal which is applied with first voltage; a first MOS transistor having a source connected to the first terminal, a drain connected to the output node and a gate to which the output voltage from the first differential amplifying circuit is applied; a second terminal which is applied with second voltage; and a second MOS transistor having a source connected to the second terminal, a drain connected to the output node and a gate to which the output voltage from the second differential amplifying circuit is applied.

The intermediate voltage generating circuit according to the present invention further comprises means for turning both of the first MOS transistor and the second MOS transistor off and setting the output node to be the second voltage in a standby mode, and operating the first MOS transistor in accordance with the output voltage from the first differential amplifying circuit to operate the second MOS transistor in accordance with the output voltage from the second differential amplifying circuit when intermediate voltage is generated.

When the first voltage is boosted voltage obtained by boosting the external power supply voltage, the second voltage is grounded voltage, the first MOS transistor is a P-channel MOS transistor and the second MOS transistor is an N-channel MOS transistor, the first differential amplifying circuit has a current mirror circuit composed of a P-channel MOS transistor and the second differential amplifying circuit has a current mirror circuit composed of an N-channel MOS transistor.

The intermediate voltage generating circuit according to the present invention further comprises a capacitor connected between the output node and the second terminal.

An intermediate voltage generating circuit according to the present invention comprises: voltage dividing means for dividing output voltage from an output node at a predetermined ratio; a differential amplifying circuit for receiving reference voltage and voltage divided by the voltage dividing means; a first terminal which is applied with first voltage; a second terminal which is applied with second voltage; a first MOS transistor having a source connected to the first terminal, a drain connected to the output node and a gate to which the output voltage from the differential amplifying circuit is applied; and a second MOS transistor having size smaller than that of the first MOS transistor and provided with a source connected to the first terminal, and a gate and a drain which are connected to the gate of the first MOS transistor.

The intermediate voltage generating circuit according to the present invention further comprises means for turning the first MOS transistor off and setting the output node to be the second voltage in a standby mode, and operating the first MOS transistor in accordance with the output voltage from the first differential amplifying circuit when intermediate voltage is generated.

When the first voltage is boosted voltage obtained by boosting the external power supply voltage, the second voltage is grounded voltage and the first MOS transistor is a P-channel MOS transistor, the differential amplifying circuit has a current mirror circuit composed of a P-channel MOS transistor.

The intermediate voltage generating circuit according to the present invention further comprises means connected between the output node and the second terminal and arranged to be operated as a constant current source and a capacitor connected between the output node and the second terminal.

An intermediate voltage generating circuit according to the present invention comprises: voltage dividing means for dividing output voltage from an output node at a predetermined ratio; first and second differential amplifying circuits for receiving reference voltage and voltage divided by the voltage dividing means; a first terminal which is applied with first voltage; a first MOS transistor having a source connected to the first terminal, a drain connected to the output node and a gate to which the output voltage from the first differential amplifying circuit is applied; a second terminal which is applied with second voltage; a second MOS transistor having a source connected to the second terminal, a drain connected to the output node and a gate to which the output voltage from the second differential amplifying circuit is applied; a third MOS transistor having size smaller than that of the first MOS transistor and provided with a source connected to the first terminal and a gate and a drain which are connected to the gate of the first MOS transistor; and a fourth MOS transistor having size smaller than that of the second MOS transistor and provided with a source connected to the second terminal and a gate and a drain which are connected to the gate of the second MOS transistor.

The intermediate voltage generating circuit according to the present invention further comprises means for turning both of the first MOS transistor and the second MOS transistor off and setting the output node to be the second voltage in a standby mode, and operating the first MOS transistor in accordance with the output voltage from the first differential amplifying circuit and operating the second MOS transistor in accordance with the output voltage from the second differential amplifying circuit when intermediate voltage is generated.

When the first voltage is boosted voltage obtained by boosting the external power supply voltage, the second voltage is grounded voltage, the first MOS transistor is a P-channel MOS transistor and the second MOS transistor is an N-channel MOS transistor, the first differential amplifying circuit has a current mirror circuit composed of a P-channel MOS transistor and the second differential amplifying circuit has a current mirror circuit composed of an N-channel MOS transistor.

The intermediate voltage generating circuit according to the present invention further comprises means connected between the output node and the second terminal and arranged to be operated as a constant current source and a capacitor connected between the output node and the second terminal.

An intermediate voltage generating circuit according to the present invention comprises: voltage dividing means for dividing output voltage from an output node at a predetermined ratio; a differential amplifying circuit for receiving reference voltage and voltage divided by the voltage dividing means; a first terminal which is applied with first voltage; a second terminal which is applied with second voltage; a first MOS transistor having a source connected to the first terminal and a drain connected to the output node; a second MOS transistor having size smaller than that of the first MOS transistor and provided with a source connected to the first terminal and a gate and a drain which are connected to the gate of the first MOS transistor; and a third MOS transistor having size smaller than that of the first MOS transistor and provided with a source connected to the second terminal, a drain connected to the gate of the first MOS transistor and a gate to which the output voltage from the differential amplifying circuit is applied.

The intermediate voltage generating circuit according to the present invention further comprises a fourth MOS transistor having size smaller than that of the first MOS transistor, and provided with a source connected to the second terminal and a gate and a drain which are connected to the gate of the third MOS transistor.

The intermediate voltage generating circuit according to the present invention further comprises means for turning the first MOS transistor off and setting the output node to be the second voltage in a standby mode, and operating the first MOS transistor in accordance with the output voltage from the first differential amplifying circuit when intermediate voltage is generated.

When the first voltage is boosted voltage obtained by boosting the external power supply voltage, the second voltage is grounded voltage, the first MOS transistor is a P-channel MOS transistor and the third MOS transistor is an N-channel MOS transistor, the differential amplifying circuit has a current mirror circuit composed of an N-channel MOS transistor, and the differential amplifying circuit is operated with the external power supply voltage.

The intermediate voltage generating circuit according to the present invention further comprises means connected between the output node and the second terminal and arranged to be operated as a constant current source and a capacitor connected between the output node and the second terminal.

An intermediate voltage generating circuit according to the present invention comprises: voltage dividing means for dividing output voltage from an output node at a predetermined ratio; first and second differential amplifying circuits for receiving reference voltage and voltage divided by the voltage dividing means; a first terminal which is applied with first voltage; a first MOS transistor having a source connected to the first terminal and a drain connected to the output node; a second terminal which is applied with second voltage; a second MOS transistor having a source connected to the second terminal and a drain connected to the output node; a third MOS transistor having size smaller than that of the first MOS transistor and provided with a source connected to the first terminal and a gate and a drain which are connected to the gate of the first MOS transistor; a fourth MOS transistor having size smaller than that of the first MOS transistor and provided with a source connected to the second terminal, a drain connected to the gate of the first MOS transistor and a gate to which the output voltage from the first differential amplifying circuit is applied; and a fifth MOS transistor having size smaller than that of the second MOS transistor and provided with a source connected to the second terminal and a gate and a drain which are connected to the gate of the second MOS transistor.

The intermediate voltage generating circuit according to the present invention further comprises a sixth MOS transistor having size smaller than that of the first MOS transistor and provided with a source connected to the second terminal and a gate and a drain which are connected to the gate of the fourth MOS transistor.

The intermediate voltage generating circuit according to the present invention further comprises means for turning both of the first MOS transistor and the second MOS transistor off and setting the output node to be the second voltage in a standby mode, and operating the first MOS transistor in accordance with the output voltage from the first differential amplifying circuit and operating the second MOS transistor in accordance with the output voltage from the second differential amplifying circuit when intermediate voltage is generated.

When the first voltage is boosted voltage obtained by boosting the external power supply voltage, the second voltage is grounded voltage, the first MOS transistor is a P-channel MOS transistor and the second and fourth MOS transistors are N-channel MOS transistors, each of the first and second differential amplifying circuits has a current mirror circuit composed of an N-channel MOS transistor and is operated with the external power supply voltage.

The intermediate voltage generating circuit according to the present invention further comprises means connected between the output node and the second terminal and arranged to be operated as a constant current source and a capacitor connected between the output node and the second terminal.

The intermediate voltage generating circuit according to the present invention further comprises switch means for switching a switch in accordance with a control signal to change the ratio of voltage division which is performed by the voltage dividing means so as to output, from the output node, the output voltage in accordance with the ratio of the voltage division performed by the voltage dividing means.

The switch means has a plurality of switching MOS transistors formed in a semiconductor substrate set to the same voltage level as that of the output node and each having a source connected to the output node and a gate to which the control signal is supplied, and a plurality of resistors each of which is connected between drains of the switching MOS transistors, and an end resistor among the plural resistors is connected to the voltage dividing means.

A nonvolatile semiconductor memory comprising at least one intermediate voltage generating circuit to supply intermediate voltage generated by the intermediate voltage generating circuit to memory cells in a memory cell array in each of a read mode, a program mode, an erase mode and a verify mode so as to perform the mode.

The nonvolatile semiconductor memory according to the present invention comprises the foregoing intermediate voltage generating circuit and arranged such that the voltage to be applied to a gate, a source or a drain of the memory cell in the memory cell array in the read mode, the program mode, the erase mode and the verify mode is generated by only the intermediate voltage generating circuit so as to perform the mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are flow charts of an automatic program mode;

FIG. 2 is a diagram showing an intermediate voltage generating system;

FIG. 8 is a circuit diagram showing an intermediate voltage generating circuit according to a first embodiment of the present invention;

FIG. 9 is a diagram showing an example of the structure of a differential amplifying circuit 31A shown in FIG. 8;

FIG. 10 is a diagram showing an example of the structure of a differential amplifying circuit 31B shown in FIG. 8;

DETAILED DESCRIPTION OF THE INVENTION

Figure 3:
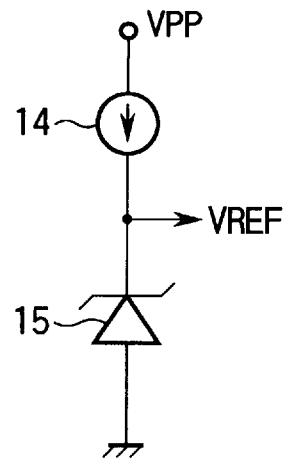
FIG. 3 is a circuit diagram showing an example of the structure of a zener diode type reference voltage generating circuit.
Figure 4:
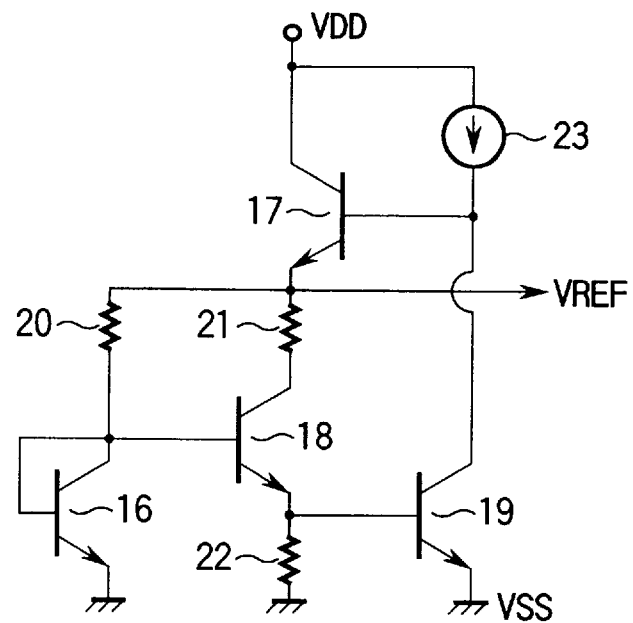
FIG. 4 is a circuit diagram showing an example of the structure of a widlar type reference voltage generating circuit.

Referring to the drawings, a nonvolatile semiconductor memory according to the present invention will now be described.

FIG. 8 shows the nonvolatile semiconductor memory having an intermediate voltage generating circuit according to a first embodiment of the present invention.

Figure 5:
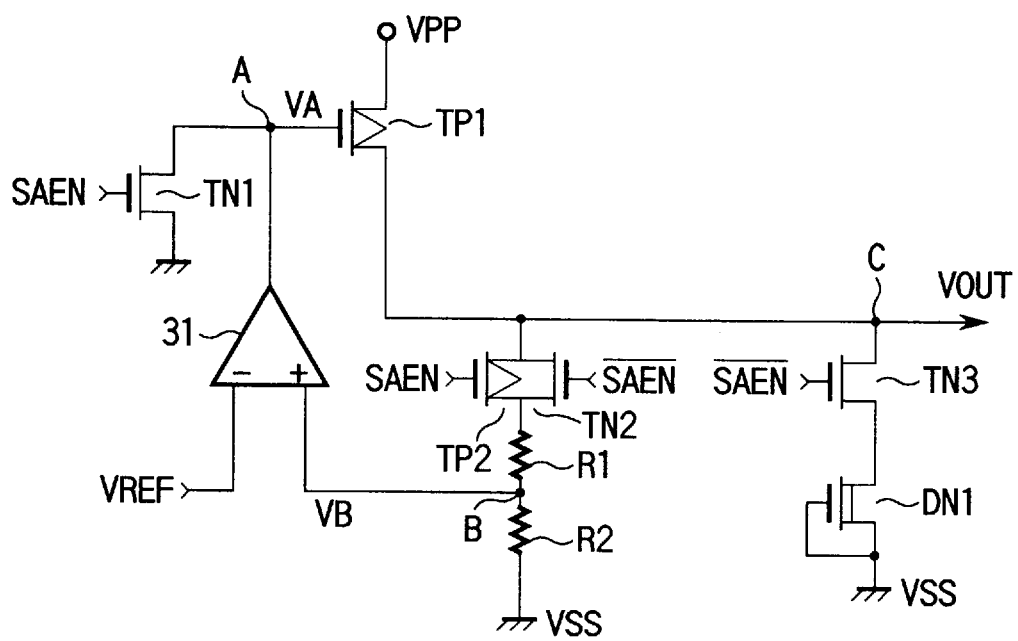
FIG. 5 is a circuit diagram showing an example of the structure of a conventional intermediate voltage generating circuit.

The intermediate voltage generating circuit according to this embodiment has an intermediate voltage generating circuit obtained by improving the intermediate voltage generating circuit shown in FIG. 5.

Reference voltage VREF is supplied to a negative input terminal of a current mirror differential amplifying circuit 31A. A gate of a pull-up P-channel MOS transistor TP1 is connected to the output of the current mirror differential amplifying circuit 31A. An N-channel MOS transistor TN1A is connected between the gate of the MOS transistor TP1 and the grounded point.

The source of the MOS transistor TP1 is supplied with boosted voltage VPP of a charge pump circuit, while the drain of the same outputs output voltage VOUT. Resistors R1 and R2 and MOS transistors TP2A and TN2A, which are connected in series, are connected in series between the drain of the MOS transistor TP1 and the grounded point.

Junction B1 between the resistor R1 and the resistor R2 is connected to a positive input terminal of the differential amplifying circuit 31A.

The reference voltage VREF is supplied to the negative input terminal of a current mirror differential amplifying circuit 31B, while the gate of a pull-down N-channel MOS transistor TN6 is connected to the output terminal of the same. An N-channel MOS transistor TN1B is connected between the gate of the MOS transistor TN6 and the grounded point.

The source of the MOS transistor TN6 is supplied with grounded voltage VSS, while output voltage VOUT is output from the drain of the same. Resistors R3 to R5 and MOS transistors TP2B and TN2B, which are connected in series, are connected in series between the drain of the MOS transistor TNG and the grounded point.

Junction B2 between the resistor R3 and the resistor R4 is connected to a positive input terminal of the differential amplifying circuit 31B. An N-channel MOS transistor TN7 is connected between the grounded point and the junction B3.

An output node A2 of the differential amplifying circuit 31B is connected to the gate of the MOS transistor TN7 through an inverter 32.

An N-channel MOS transistor TN3 and a depression type N-channel MOS transistor DN1 are, in series, connected between the drains of the MOS transistors TP1 and TN6 and the grounded point. The gate and the source of the MOS transistor DN1 are connected to each other.

Control signal SEAN is supplied to the gate of each of the MOS transistors TN1A, TN1B, TP2A and TN2B, while control signal $\overline{\text{SEAN}}$ is supplied to the gate of each of the MOS transistors TN2A, TN2B and TN3.

Resistors R1 to R5 are made of resistance devices, such as polysilicon resistors or MOS transistors or diodes.

FIG. 9 shows an example of the structure of the current mirror differential amplifying circuit 31A shown in FIG. 8. FIG. 10 shows an example of the current mirror differential amplifying circuit 31B shown in FIG. 8.

The differential amplifying circuit 31A has a current mirror circuit composed of a P-channel MOS transistor which has an excellent consistency with the MOS transistor TP1 in order to drive the P-channel MOS transistor TP1.

That is, the source of each of P-channel MOS transistors TP3 and TP4 is connected to the power supply terminal adjacent to the boosted voltage VPP. The gates of the MOS transistors TP3 and TP4 are connected to each other such that the junction is connected to the drain of the MOS transistor TP4.

The source of an N-channel MOS transistor TN8 is connected to the power supply terminal adjacent to the grounded voltage VSS through an N-channel MOS transistor TN10, while the drain of the same is connected to the drain of the MOS transistor TP3. The source of an N-channel MOS transistor TN9 is connected to a power supply terminal adjacent to the grounded voltage VSS through the MOS transistor TN10, while the drain of the same is connected to the drain of the MOS transistor TP4.

The reference voltage VREF is applied to the gate of the MOS transistor TN8. Voltage VB1 at the junction B1 is applied to the gate of a MOS transistor TN9. Output voltage VA1 from the differential amplifying circuit 31A is output from the drain of each of the MOS transistors TP3 and TN8. The gate of the MOS transistor TN10 is supplied with the control signal $\overline{\text{SEAN}}$.

The differential amplifying circuit 31B has a current mirror circuit composed of an N-channel MOS transistor having excellent consistency with the N-channel MOS transistor TN6 in order to drive the MOS transistor TN6.

That is, the sources of N-channel MOS transistors TN11 and TN12 are connected to the power supply terminal adjacent to the grounded voltage VSS. The gates of the MOS transistors TN11 and TN12 are connected to each other such that the junction is connected to the drain of the MOS transistor TN12.

The source of a P-channel MOS transistor TP6 is connected to the power supply terminal adjacent to the boosted voltage VPP through the P-channel MOS transistor TP8, while the drain of the same is connected to the drain of the MOS transistor TN11. The source of the P-channel MOS transistor TP7 is connected to the power supply terminal adjacent to the boosted voltage VPP through the MOS transistor TP8, while the drain of the same is connected to the drain of the MOS transistor TN12.

The reference voltage VREF is applied to the gate of the MOS transistor TP6. Voltage VB2 at the junction B2 is applied to the gate of the MOS transistor TP7. Output voltage VA2 from the differential amplifying circuit 31B is output from the drain of each of the MOS transistors TP6 and TN11. The gate of the MOS transistor TP8 is supplied with control signal SAEN.

As a result, the cut off characteristic of the intermediate voltage generating circuit can be improved and error occurring when the intermediate voltage generating circuit has been stabilized can be prevented.

In the intermediate voltage generating circuit having the above-mentioned structure, the current mirror differential amplifying circuit 31A detects and amplifies the difference between the reference voltage VREF and the voltage VB1 at the junction B1. In accordance with the output from the differential amplifying circuit 31A, the pull-up P-channel MOS transistor TP1 is driven so that the output voltage VOUT is maintained at a constant level.

Simultaneously, the current mirror differential amplifying circuit 31B detects and amplifies the difference between the reference voltage VREF and the voltage VB2 at the junction B2. In accordance with the output from the differential amplifying circuit 31B, the pull-down N-channel MOS transistor TN6 is driven so that the output voltage VOUT is maintained at a constant level.

That is, in this embodiment, the intermediate voltage generating circuit of a type, in which the voltage of the output node C is electrically charged to the boosted voltage VPP, and then the charge of the output node C is discharged so that the output voltage VOUT is stabilized to a constant level, is structured such that the pull-down N-channel MOS transistor TN6 is provided in addition to the pull-up P-channel MOS transistor TP1.

Also a feedback loop of the differential amplifying circuit 31B is provided adjacent to the pull-down N-channel MOS transistor TN6.

Figure 11:
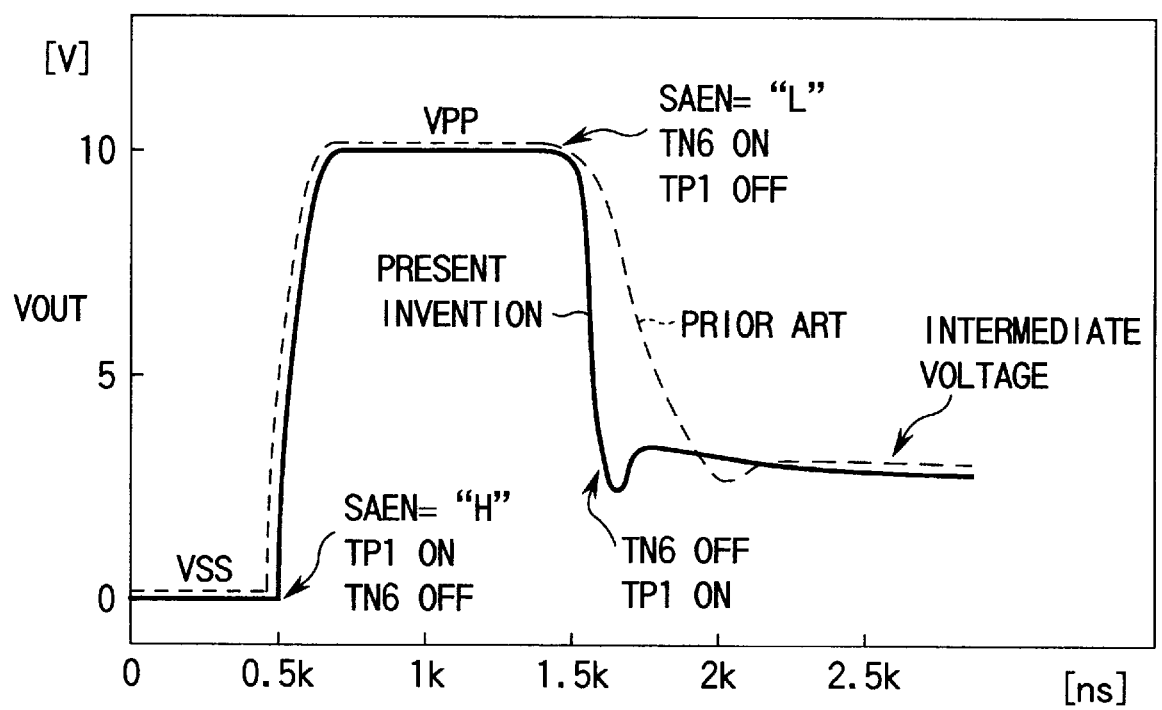
FIG. 11 is a diagram showing change of the output voltage which takes place in the first embodiment of the present invention as compared with the conventional structure.

As a result, the time required for the voltage of the output node C to be lowered and stabilized from the boosted voltage VPP to the predetermined output voltage VOUT can significantly be shortened, as shown in FIG. 11.

Since the pull-down N-channel MOS transistor TN6 is provided, the levels of the resistors R1 and R2 can be raised and the electric current which flows to the grounded point through the resistors R1 and R2 can be lowered. Therefore, the electric power consumption required when the output voltage VOUT has been stabilized can be reduced as compared with the conventional structure.

Since the inverter 32 and the MOS transistor TN7 are provided, the pull-down N-channel MOS transistor TN6 interrupts its operation to lower the voltage of the output node C after the output voltage VOUT has been lowered to the predetermined level. Therefore, the voltage of the output node C is controlled by only the pull-up P-channel MOS transistor TP1 so that oscillation of the output voltage VOUT is prevented.

The operation of the intermediate voltage generating circuit shown in FIG. 8 will now be described.

When the intermediate voltage generating circuit is not operated, the control signal SAEN is required to be set to be "H" level.

When the control signal SAEN is "H" level, the MOS transistors TN1A and TN1B are turned on. On the other hand, the MOS transistors (the transfer gates) TP2A, TP2B, TN2A and TN2B and the MOS transistor TN3 are turned off. That is, the output node A of the differential amplifying circuit 31 is made to be the grounded voltage VSS so that the MOS transistor TP1 is always turned on. On the other hand, the MOS transistors TP2A, TP2B, TN2A, TN2B, TN3 and TN6 have been turned off. Therefore, the output voltage VOUT is made to be the boosted voltage VPP.

When the intermediate voltage generating circuit is operated to obtain the predetermined output voltage VOUT, the control signal SAEN is required to be "L" level.

When the control signal SAEN has been made to be the "L" level, the MOS transistors TN1A and TN1B are turned off. On the other hand, the MOS transistors (the transfer gates) TP2A, TP2B, TN2A and TN2B and the MOS transistor TN3 are turned on.

Since the output node C has been electrically charged to the boosted voltage VPP, the electric current flows from the output node C to the grounded point through the MOS transistors TP2A and TN2A and the resistors R1 and R2. Moreover, the electric current flows from the output node C to the grounded point through the MOS transistors TP2B and TN2B and the resistors R3 to R5.

Since the voltages VB1 and VB2 at the junctions B1 and B2 are, at this time, higher than the reference voltage VREF, the outputs from the differential amplifying circuits 31A and 31B are made to be the "H" level. Thus, the pull-up MOS transistor TP1 is turned off, while the pull-down MOS transistor TN6 is turned on.

Therefore, the charge of the output node C is discharged to the grounded point through a route formed from the output node C to pass through the resistors R1 and R2, a route formed from the output node C to pass through the resistors R3 to R5 and a route formed from the same to pass through the pull-down N-channel MOS transistor TN6.

That is, even if the levels of the resistors R1 to R5 are raised, the voltage of the output node C can quickly be lowered as compared with the conventional structure. Sine the resistors R1 to R5 have high levels, the electric power consumption when the output voltage VOUT has been stabilized can be reduced.

When the voltage of the output node C has been lowered and the voltage VB2 at the junction B2 has been made to be lower than the reference voltage VREF, the output from the differential amplifying circuit 31B is made to be the "L" level. Thus, the pull-down MOS transistor TN6 is turned off.

The output from the differential amplifying circuit 31B is supplied to the gate of the MOS transistor TN7 through the inverter 32. Therefore, when the output from the differential amplifying circuit 31B has been made to be the "L" level, the MOS transistor TN7 is turned on and thus the voltage VB2 at the junction B2 is further lowered.

That is, after the output voltage VOUT (the required intermediate voltage) has been made to be lower than the predetermined level, the pull-down MOS transistor TN6 maintains the turned off state until the output voltage VOUT is stabilized to the predetermined level.

Since the voltage VB1 at the junction B1 is, at this time, made to be lower than the reference voltage VREF, the output from the differential amplifying circuit 31A is made to be the "L" level. Thus, the pull-up MOS transistor TP1 is turned on. When the voltage VB1 at the junction B1 is made to be the same as the reference voltage VREF, the intermediate voltage generating circuit outputs the constant output voltage VOUT.

As described above, according to the first embodiment of the present invention, the intermediate voltage generating circuit of a type, in which the voltage of the output node C is previously electrically charged to the boosted voltage VPP, and then the charge of the output node C is discharged to stabilize the output voltage VOUT to a predetermined level, is provided with the pull-down N-channel MOS transistor TN6 in addition to the pull-up P-channel MOS transistor TP1.

When the voltage (the boosted voltage VPP) of the output node C has been rapidly lowered to a level lower than a predetermined level, the pull-down N-channel MOS transistor TN6 is controlled to maintain the state where it is turned off until the voltage of the output node C is stabilized.

Therefore, the time required for the voltage of the output node C to be stabilized from the boosted voltage VPP to the predetermined output voltage VOUT can significantly be shortened, as shown in FIG. 11.

Since the pull-down N-channel MOS transistor TN6 is provided, the levels of the resistors R1 and R2 can be raised. Since the electric current which flows to the grounded point through the resistors R1 and R2 can be lowered, the electric power consumption, when the output voltage VOUT has been stabilized, can be reduced.

The pull-down N-channel MOS transistor TN6 interrupts its operation to lower the voltage of the output node C after the output voltage VOUT has been lowered to the predetermined voltage. Therefore, the voltage of the output node C is controlled only by the pull-up P-channel MOS transistor TP1 so that oscillation of the output voltage VOUT is effectively prevented.

As a result, the requirement for reducing the electric power consumption and that for raising the operation speed can simultaneously be satisfied.

A second embodiment of the present invention will now be described.

Figure 12:
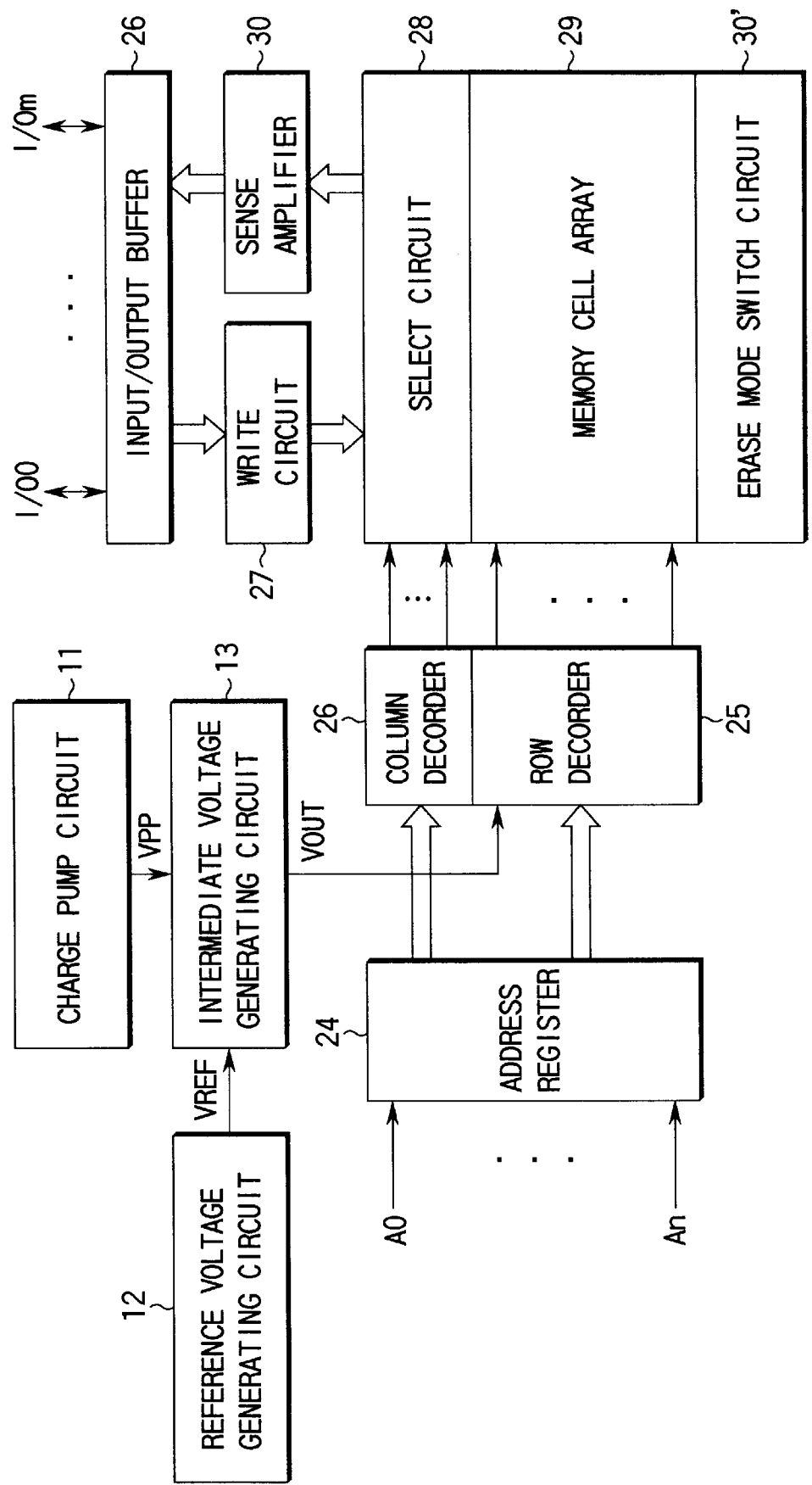
FIG. 12 is a diagram showing an intermediate voltage generating system.

FIG. 12 schematically shows the overall body of a non-volatile semiconductor memory having the intermediate voltage generating circuit according to the present invention.

A charge pump circuit 11 generates boosted voltage VPP, while a reference voltage generating circuit 12 generates reference voltage VREF. An intermediate voltage generating circuit 13 generates predetermined output voltage VOUT from boosted voltage VPP to correspond to the program mode, a verify mode or the like with respect to the reference voltage VREF.

Internal address signals (or external address signals) A0 to An are supplied to a row decoder 25 and a column decoder 26 through an address register 24. Output voltage VOUT from the intermediate voltage generating circuit 13 is allowed to pass through the row decoder 25, and then applied to predetermined word lines selected in response to the address signals A0 to An.

In the program mode, data is allowed to pass through an input/output buffer 26', a write circuit 27 and a selection circuit 28, and then supplied to predetermined memory cells in a memory cell array 29.

In the read mode, data is allowed to pass trough the selection circuit 28 and a sense amplifier 30 so as to be used in the verify operation or further allowed to pass trough the input/output buffer 26' so as to be output to the outside of the chip.

In the erase mode, an erase switch circuit 30' switches the voltage to be applied to the source of the memory cell.

Figure 13:
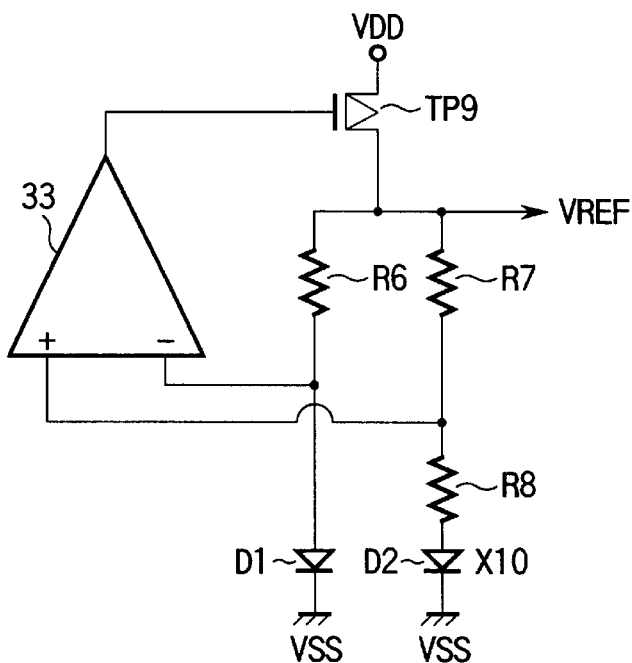
FIG. 13 is a circuit diagram showing an example of the structure of the reference voltage generating circuit shown in FIG. 12.

FIG. 13 shows an example of the reference voltage generating circuit 12 shown in FIG. 12.

The reference voltage generating circuit is different from the conventional widlar BGR (Band Gap Reference circuit) shown in FIG. 2 in that the bipolar transistor is excluded.

That is, the output from a difference amplifying circuit 33 is applied to the P-channel MOS transistor TP9. The difference amplifying circuit 33 is composed of a MOS transistor.

The source of the MOS transistor TP9 is connected to the power supply terminal adjacent to the external power source VDD, while the drain of the same outputs the reference voltage VREF.

A resistor R6 and a diode D1 are in series connected between the drain of the MOS transistor TP9 and the grounded point. The junction between the resistor R6 and the diode D1 is connected to the negative input terminal of the difference amplifying circuit 33.

Resistors R7 and R8 and a diode D2 are, in series, connected between the drain of the MOS transistor TP9 and the grounded point. The junction between the resistor R7 and the resistor R8 is connected to the positive input terminal of the difference amplifying circuit 33.

Figure 14:
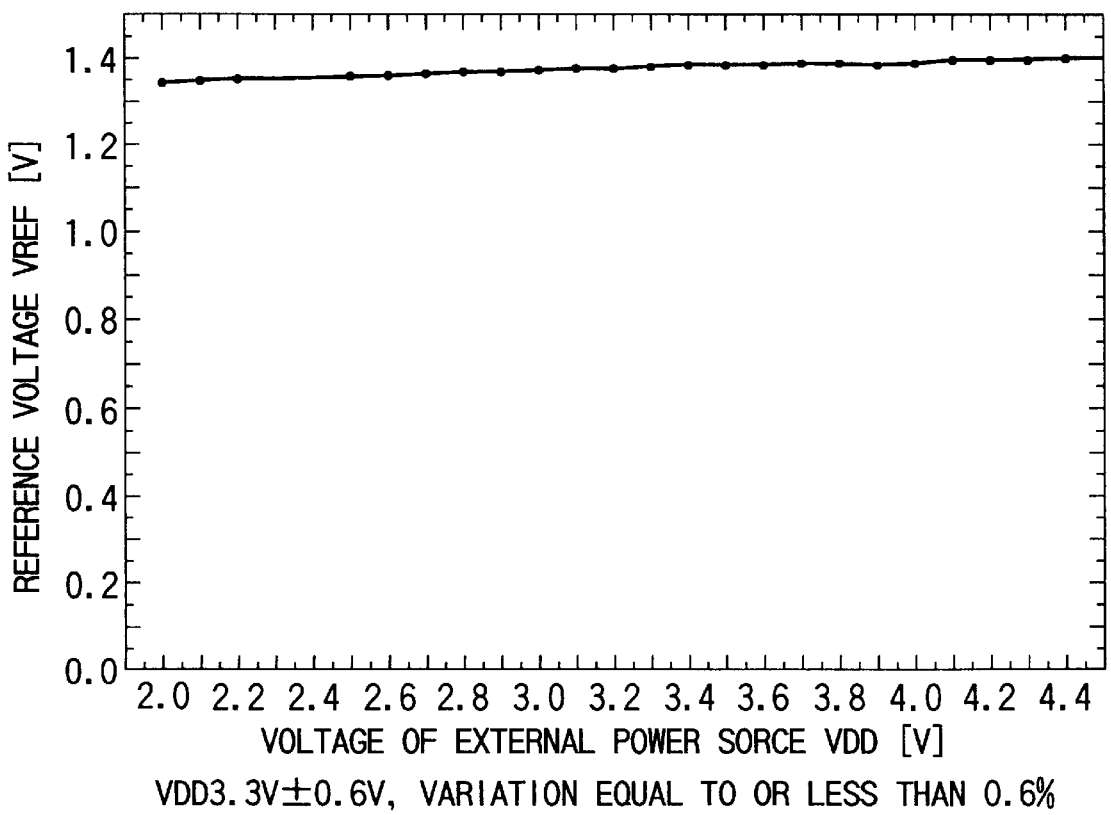
FIG. 14 is a graph showing the characteristics of the reference voltage generating circuit shown in FIG. 13.

Since forward-directional diodes D1 and D2 for use in the above-mentioned reference voltage generating circuit do not considerably depend upon the processing condition, their characteristics can considerably be stabilized. Since the reference voltage generating circuit does not considerably depend upon the external power source VDD as shown in FIG. 14, the stable reference voltage VREF can be generated.

Figure 15:
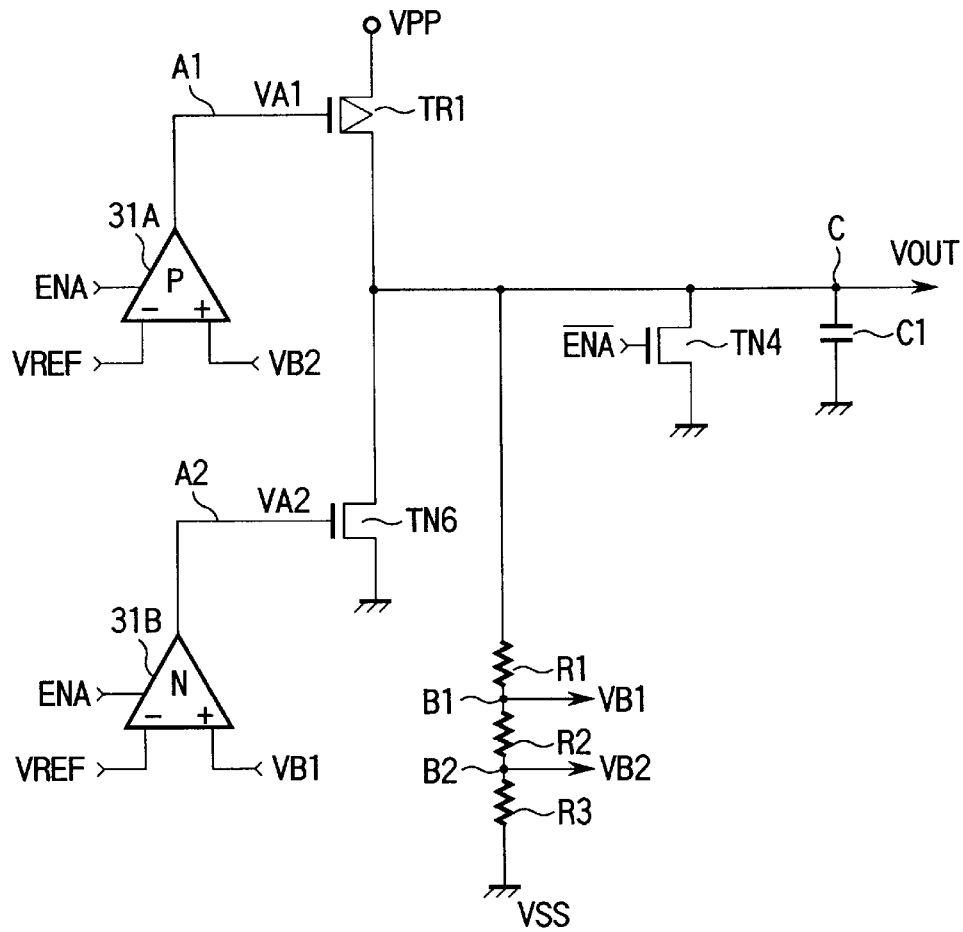
FIG. 15 is a circuit diagram showing a modification of the intermediate voltage generating circuit shown in FIG. 4.

FIG. 15 shows an example of the structure of the intermediate voltage generating circuit 13 shown in FIG. 12.

The reference voltage VREF is applied to the negative side input terminal of the current mirror differential amplifying circuit 31A, while the gate of the pull-up P-channel MOS transistor TP1 is connected to the output terminal of the same.

The source of the MOS transistor TP1 is supplied with the boosted voltage VPP of the charge pump circuit, while the drain of the same outputs the output voltage VOUT.

The reference voltage VREF is applied to the negative side input terminal of the current mirror differential amplifying circuit 31B, while the gate of the pull-down N-channel MOS transistor TN6 is connected to the output terminal of the same.

The source of the MOS transistor TN6 is supplied with grounded voltage VSS, while the drain of the same outputs the output voltage VOUT.

Resistors R1 to R3 are in series connected between the drain of each of the MOS transistors TP1 and TN6 and the grounded point. Junction B1 between the resistor R1 and the resistor R2 is connected to the positive side input terminal of the differential amplifying circuit 31B, while junction B2 between the resistor R2 and the resistor R3 is connected to the positive side input terminal of the differential amplifying circuit 31A.

An N-channel MOS transistor TN4 is connected between the drain of each of the MOS transistors TP1 and TN6 and the grounded point. The gate of the MOS transistor TN4 is supplied with inverted signal $\overline{ENA}$ of the enable signal.

A capacitor C1 is connected between the drain of each of the MOS transistors TP1 and TN6 and the grounded point. The capacitor C1 is provided for the purpose of compensating the phase delay for the feedback loop of each of the differential amplifying circuits 31A and 31B so as to stabilize the output voltage VOUT.

In the intermediate voltage generating circuit having the above-mentioned structure, the current mirror differential amplifying circuit 31A detects and amplifies the difference between the reference voltage VREF and the voltage VB2 at the junction B2. In accordance with the output from the current mirror differential amplifying circuit 31A, the pull-up P-channel MOS transistor TP1 is driven so as to maintain the output voltage VOUT at a constant level.

The current mirror differential amplifying circuit 31B detects and amplifies the difference between the reference voltage VREF and the voltage VB1 at the junction B1. In accordance with the output from the differential amplifying circuit 31B, the pull-down N-channel MOS transistor TN6 is driven so as to maintain the output voltage VOUT at a constant level.

That is, the voltage of the output node C is controlled when the pull-up MOS transistor TP1 and the pull-down MOS transistor TN6 are turned on/off so as to be a predetermined intermediate voltage level apart from the grounded voltage VSS (or the boosted voltage VPP).

If the positive side input voltages for the differential amplifying circuits 31A and 31B are made to be the same, the output voltage VOUT can easily be oscillated. Therefore, the positive side input voltages for the differential amplifying circuits 31A and 31B are made to be different levels so as to provide a non-sensitive zone when the output voltage VOUT is set. Thus, oscillation of the output voltage VOUT is prevented.

Figure 16:
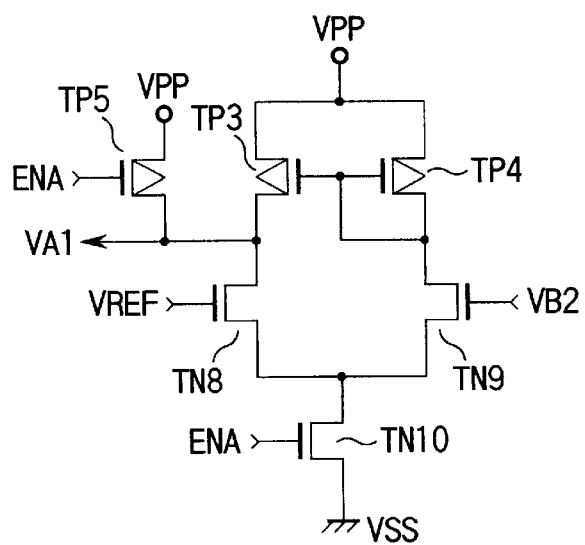
FIG. 16 is a diagram showing an example of the structure of the differential amplifying circuit 31A shown in FIG. 15.
Figure 17:
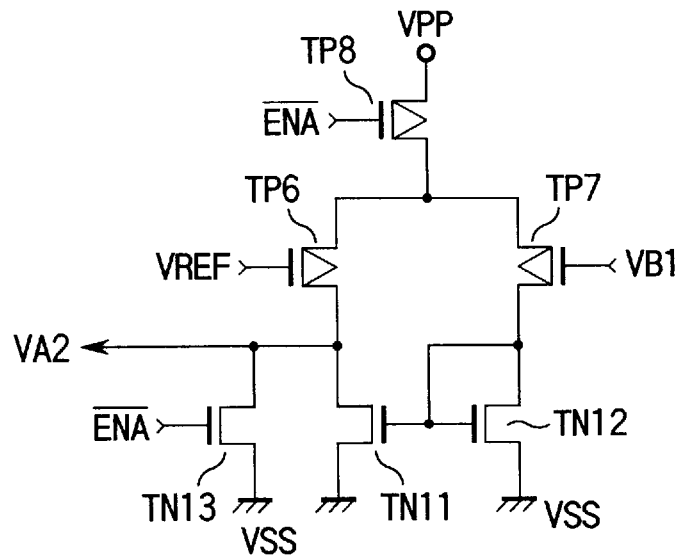
FIG. 17 is a diagram showing an example of the structure of the differential amplifying circuit 31B shown in FIG. 15.

FIG. 16 shows an example of the structure of the current mirror differential amplifying circuit 31A shown in FIG. 15. FIG. 17 shows an example of the structure of the current mirror differential amplifying circuit 31B shown in FIG. 15.

The differential amplifying circuit 31A has a current mirror circuit composed of a P-channel MOS transistor having excellent existency with a P-channel MOS transistor TP1 in order to drive the MOS transistor TP1.

That is, the source of each of the P-channel MOS transistors TP3 and TP4 is connected to the power supply terminal adjacent to the boosted voltage VPP. The gates of the MOS transistor TP3 and TP4 are connected to each other such that their junction is connected to the drain of the MOS transistor TP4.

The source of the N-channel MOS transistor TN8 is connected to the power supply terminal adjacent to the grounded voltage VSS through the N-channel MOS transistor TN10, while the source of the same is connected to the drain of the MOS transistor TP3. The source of the N-channel MOS transistor TN9 is connected to the power supply terminal adjacent to the grounded voltage VSS through the MOS transistor TN10, while the drain of the same is connected to the drain of the MOS transistor TP4.

The P-channel MOS transistor TP5 is connected between the power supply terminal adjacent to the boosted voltage VPP and the drain of each of the MOS transistors TP3 and TN8.

The reference voltage VREF is applied to the gate of the MOS transistor TN8, while the voltage VB2 at the junction B2 is applied to the gate of the MOS transistor TN9. Output voltage VA1 from the differential amplifying circuit 31A is output from the drain of each of the MOS transistors TP3 and TN8.

The gate of each of the MOS transistors TP5 and TN10 is supplied with enable signal ENA.

The differential amplifying circuit 31B has a current mirror circuit composed of an N-channel MOS transistor having excellent consistency with the N-channel MOS transistor TN6 in order to drive the MOS transistor TN6.

That is, the source of each of the N-channel MOS transistors TN11 and TN12 is connected to the power supply terminal adjacent to the grounded voltage VSS. The gates of the MOS transistors TN11 and TN12 are connected to each other such that their junction is connected to the drain of the MOS transistor TN12.

The source of the P-channel MOS transistor TP6 is connected to the power supply terminal adjacent to the boosted voltage VPP through the P-channel MOS transistor TP8, while the drain of the same is connected to the drain of the MOS transistor TN11. The source of the P-channel MOS transistor TP7 is connected to the power supply terminal adjacent to the boosted voltage VPP through the MOS transistor TP8, while the drain of the same is connected to the drain of the MOS transistor TN12.

An N-channel MOS transistor TN13 is connected between the power supply terminal adjacent to the grounded voltage VSS and the drain of each of the MOS transistors TP6 and TN11.

The reference voltage VREF is applied to the gate of the MOS transistor TP6, while the voltage VB1 at the junction B1 is applied to the gate of the MOS transistor TP7. Output voltage VA2 from the differential amplifying circuit 31B is output from the drain of each of the MOS transistors TP6 and TN11.

The gate of each of the MOS transistors TP8 and TN13 is supplied with the inverted signal $\overline{ENA}$ of the enable signal.

As a result, the cut off characteristic of the intermediate voltage generating circuit can be improved and error when it has been stabilized can be prevented.

The operation of the intermediate voltage generating circuit shown in FIG. 15 will now be described.

When the intermediate voltage generating circuit is not operated, the enable signal ENA is required to be set to be "L" level.

When the enable signal ENA is at the "L" level, the output from the differential amplifying circuit 31A is made to be the "H" level (VPP). On the other hand, the output from the current mirror differential amplifying circuit 31B is made to be "L" level (VSS). Therefore, both of the pull-up MOS transistor TP1 and the pull-down MOS transistor TN6 are turned off.

Since the MOS transistor TN4 is turned on, the output node C is made to be the grounded voltage VSS.

When the intermediate voltage generating circuit is operated to obtain the predetermined output voltage VOUT, the enable signal ENA is required to be set to be the "H" level.

When the enable signal ENA has been made to be the "H" level, the differential amplifying circuits 31A and 31B are made to be operable. Moreover, the MOS transistor TN4 is turned off.

Since the voltage level of the output node C is the grounded voltage VSS immediately after the enable signal ENA has been made to be the "H" level, the voltages VB1 and VB2 at the junctions B1 and B2 are lower than the reference voltage VREF. Therefore, the output from each of the differential amplifying circuits 31A and 31B is made to be "L" level. Thus, the pull-up MOS transistor TP1 is turned on, while the pull-down MOS transistor TN6 is turned off.

Therefore, the voltage of the output node C is gradually raised.

If the voltage of the output node C is raised and thus the voltage VB1 at the junction B1 is higher than the reference voltage VREF, the output from the differential amplifying circuit 31B is made to be the "H" level so that the pull-down MOS transistor TN6 is turned on.

That is, after the output voltage VOUT has been raised to be higher than a predetermined level (the lower limit of a non-sensitive zone), the pull-down MOS transistor TN6 is turned on so that rise of the output voltage VOUT is prevented When the voltage of the output node C has been further raised such that the voltage VB2 at the junction B2 is higher than the reference voltage VREF, the output from the differential amplifying circuit 31A is made to be "H" level so that the pull-up MOS transistor TP1 is turned off.

That is, after the output voltage VOUT has been raised to be higher than the predetermined level (the upper limit of the non-sensitive zone), the pull-up MOS transistor TP1 is turned off so that the output voltage VOUT is lowered.

Therefore, the output voltage VOUT is stabilized to a constant level in the non-sensitive zone.

Figure 18:
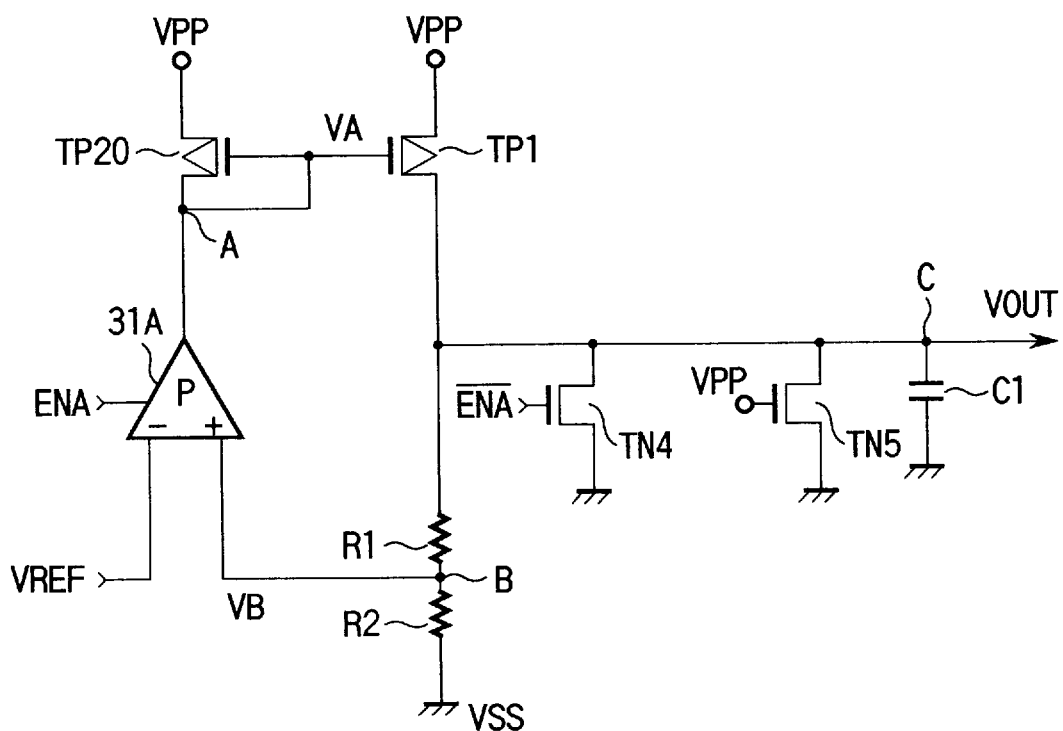
FIG. 18 is a circuit diagram showing an intermediate voltage generating circuit according to a first modification of a second embodiment of the present invention.

FIG. 18 shows a nonvolatile semiconductor memory having an intermediate voltage generating circuit according to a first modification of the second embodiment of the present invention.

Figure 6:
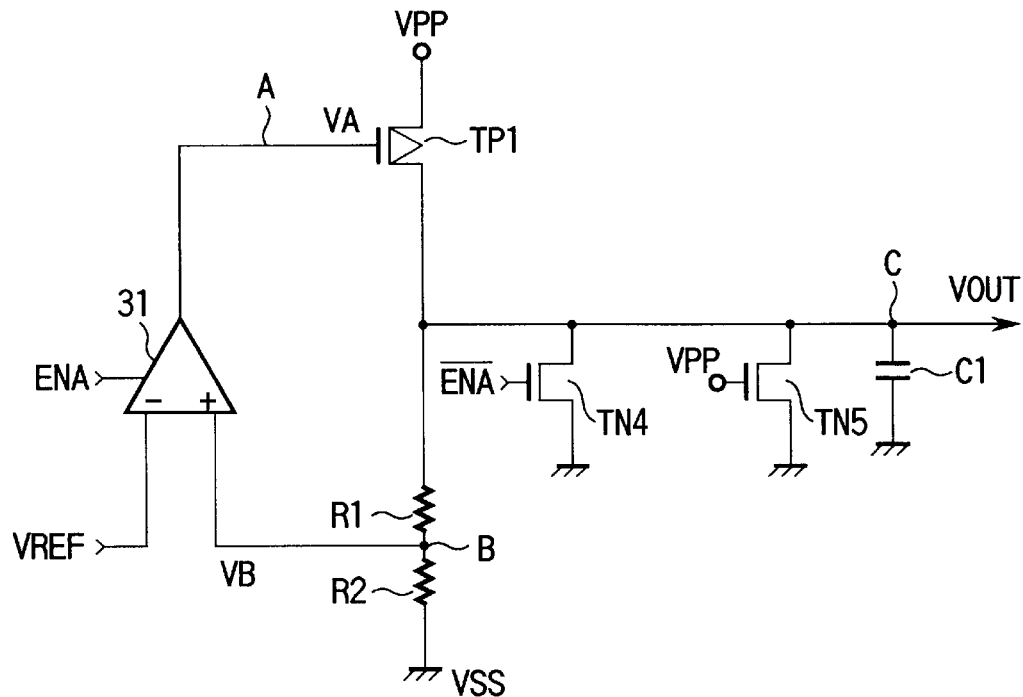
FIG. 6 is a circuit diagram showing an example of the structure of the conventional intermediate voltage generating circuit.
Figure 7:
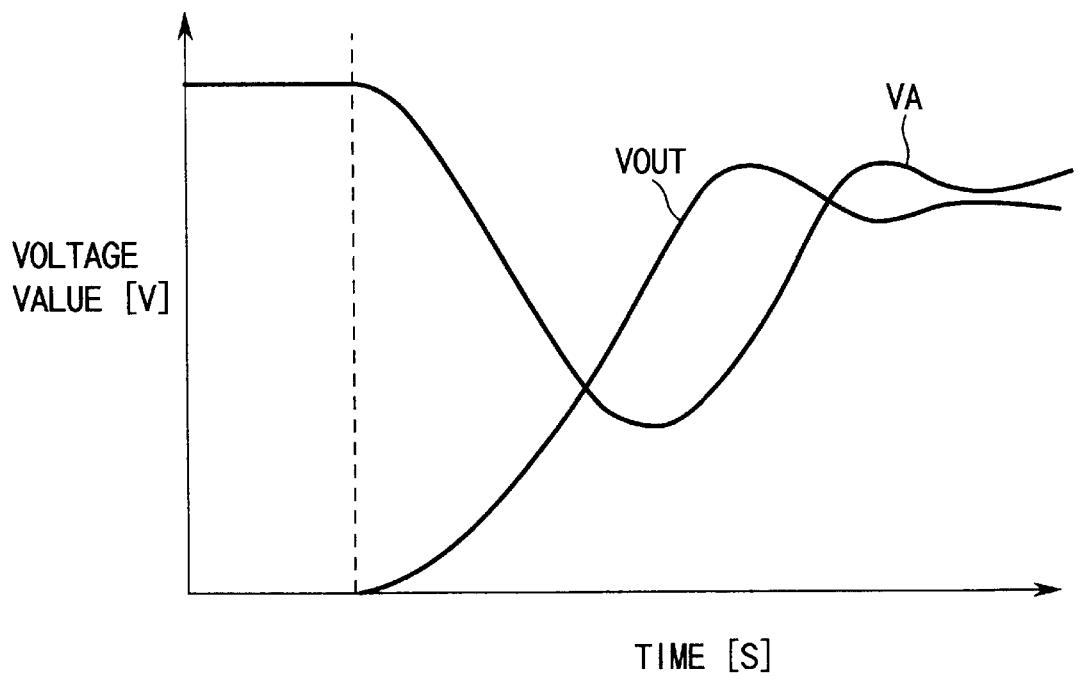
FIG. 7 is a graph showing a waveform of output voltage from the circuit shown in FIG. 6.

The intermediate voltage generating circuit according to this modification has a structure obtained by modifying the intermediate voltage generating circuit shown in FIG. 6.

The negative side input terminal of the current mirror differential amplifying circuit 31A is supplied with the reference voltage VREF, while the gate of the pull-up P-channel MOS transistor TP1 is connected to the output terminal of the same. The differential amplifying circuit 31 is controlled in accordance with the enable signal ENA such that the differential amplifying circuit 31A can be operated when the enable signal ENA is on the "H" level.

The source of the MOS transistor TP1 is applied with the boosted voltage VPP of the charge pump circuit, while the drain of the same outputs the output voltage VOUT. The resistors R1 and R2 are in series connected between the drain of the MOS transistor TP1 and the grounded point. The junction B between the resistors R1 and R2 is connected to the positive side input terminal of the differential amplifying circuit 31A.

The N-channel MOS transistor TN4 is connected between the drain of the MOS transistor TP1 and the grounded point. The gate of the MOS transistor TN4 is supplied with the inverted signal $\overline{ENA}$ of the enable signal.

The N-channel MOS transistor TN5 is connected between the drain of the MOS transistor TP1 and the drain. The MOS transistor TN5 has relatively small size so as to prevent rise of the output voltage VOUT occurring attributable to the overshoot, sub-threshold leak current, the capacity coupling with the power source and the like.

The capacitor C1 is connected between the drain of the MOS transistor TP1 and the grounded point. The capacitor C1 compensates the phase delay for the feedback loop of the differential amplifying circuit 31 so as to stabilize the output voltage VOUT.

A P-channel MOS transistor TP20 is connected between the power supply terminal adjacent to the boosted voltage VPP and the output node A of the differential amplifying circuit 31A. The gate and drain of the MOS transistor TP20 are connected to each other.

The size (the drive force) of the MOS transistor TP20 is made to be smaller than the size (the drive force) of the pull-up MOS transistor TP1. Assuming that the size of the MOS transistor TP20 is 1, the size of the pull-up MOS transistor TP1 is made to be N.

Note that the differential amplifying circuit 31A has a current mirror circuit composed of the P-channel MOS transistor structured, for example, as shown in FIG. 8.

In the intermediate voltage generating circuit having the above-mentioned structure, the P-channel MOS transistor TP20 having small size is connected between the power supply terminal adjacent to the boosted voltage VPP and the output node A of the differential amplifying circuit 31A.

Since the MOS transistor TP20 is provided, oscillation of the output voltage VOUT can effectively be prevented as shown in FIG. 12 so that stable intermediate voltage is quickly obtained.

Figure 20:
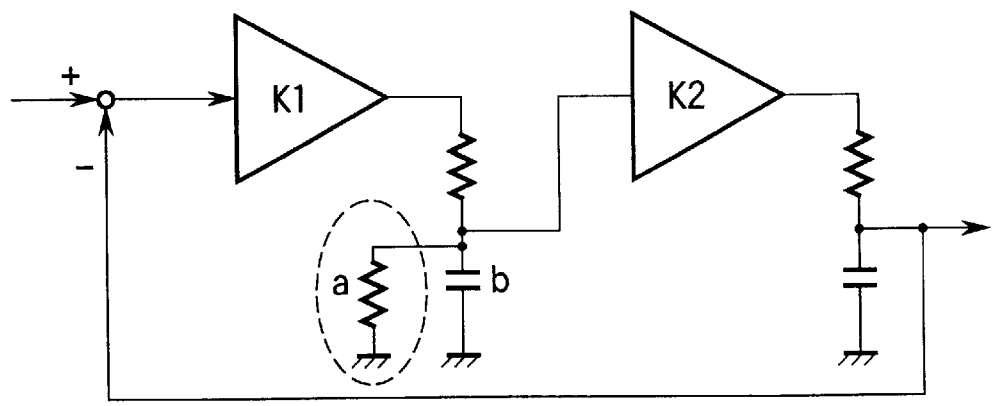
FIG. 20 is a diagram showing a mode of a control system for the circuit shown in FIG. 18.

FIG. 20 shows a simple model of the control system of the intermediate voltage generating circuit shown in FIG. 18.

Symbol K1 corresponds to the current mirror differential amplifying circuit, and K2 corresponds to the pull-up P-channel MOS transistor. Symbol a represents the resistance of a newly provided MOS transistor having the small size, and b represents the gate capacity of the pull-up P-channel MOS transistor.

The intermediate voltage generating circuit according to this modification is different from the conventional intermediate voltage generating circuit only in the existence of the resistor a.

The resistor a eliminates the influence of the capacity b of the feedback loop of the differential amplifying circuit, that is, causes the output from K1 to be supplied to K2 without delay. Therefore, the feedback speed can be raised so that the oscillation of the output voltage VOUT is prevented.

Figure 21:
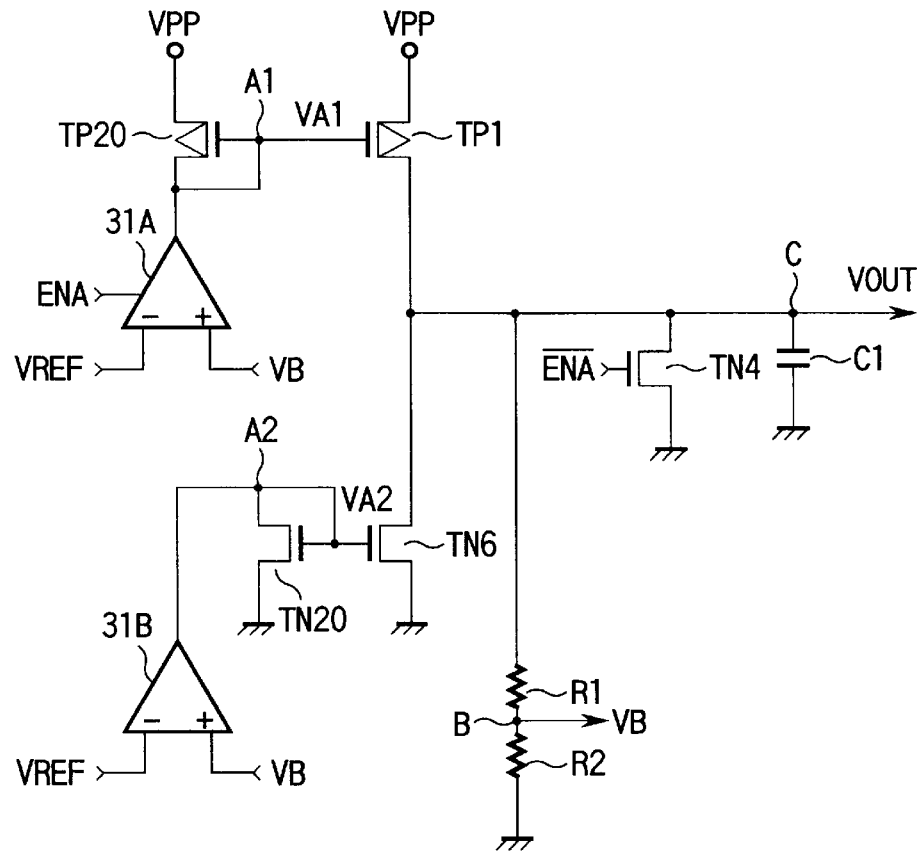
FIG. 21 is a circuit diagram showing an intermediate voltage generating circuit according to a second modification of the second embodiment of the present invention.

FIG. 21 shows a nonvolatile semiconductor memory having an intermediate voltage generating circuit according to a second modification of the second embodiment of the present invention.

The intermediate voltage generating circuit according to this modification is the modification of the intermediate voltage generating circuit shown in FIG. 15.

The reference voltage VREF is supplied to the negative side input terminal of the current mirror differential amplifying circuit 31A, while the gate of the pull-up P-channel MOS transistor TP1 is connected to the output terminal of the same. The differential amplifying circuit 31A is controlled in accordance with the enable signal ENA such that it can be operated when the ENA is on the "H" level.

The boosted voltage VPP of the charge pump circuit is supplied to the source of the MOS transistor TP1, while the output voltage VOUT is output from the drain of the same.

The reference voltage VREF is supplied to the negative side input terminal of the current mirror differential amplifying circuit 31B, while the gate of the pull-down N-channel MOS transistor TN6 is connected to the output terminal of the same. The differential amplifying circuit 31B is controlled in accordance with the enable signal ENA such that it can be operated when the enable signal ENA is on the "H" level.

The source of the MOS transistor TN6 is supplied with the grounded voltage VSS, while the drain of the same outputs the output voltage VOUT.

Resistors R1 and R2 are in series connected between the drain of each of the MOS transistors TP1 and TN6 and the grounded point. The junction B between the resistor R1 and the resistor R2 is connected to the positive input terminal of each of the differential amplifying circuits 31A and 31B.

The N-channel MOS transistor TN4 is connected between the drain of each of the MOS transistors TP1 and TN6 and the grounded point. The gate of the MOS transistor TN4 is supplied with the inverted signal $\overline{ENA}$ of the enable signal.

The capacitor C1 is connected between the drain of each of the MOS transistors TP1 and TN6 and the grounded point. The capacitor C1 is provided for the purpose of compensating the phase delay for the feedback loop of the differential amplifying circuits 31A and 31B so as to stabilize the output voltage VOUT.

Moreover, the P-channel MOS transistor TP20 is connected between the power supply terminal adjacent to the boosted voltage VPP and an output node A1 of the differential amplifying circuit 31A. The gate and drain of the MOS transistor TP20 are connected to each other.

The size (the drive force) of the MOS transistor TP20 is made to be smaller than the size (the drive force) of the pull-up MOS transistor TP1. Assuming that the size of the MOS transistor TP20 is 1, the size of the pull-up MOS transistor TP1 is made to be N.

The N-channel MOS transistor TN20 is connected between the power supply terminal adjacent to the grounded voltage VSS and the output node A2 of the differential amplifying circuit 31B. The gate and drain of the MOS transistor TN20 are connected to each other.

The size (the drive force) of the MOS transistor TN20 is made to be smaller than the size (the drive force) of the pull-down MOS transistor TN6. Assuming that the size of the MOS transistor TN20 is 1, the size of the pull-down MOS transistor TN6 is made to be N.

The differential amplifying circuit 31A has the current mirror circuit composed of the P-channel MOS transistor structured, for example, as shown in FIG. 9, while the differential amplifying circuit 31B has the current mirror circuit composed of the N-channel MOS transistor structured, for example, as shown in FIG. 10.

In the intermediate voltage generating circuit having the above-mentioned structure, the P-channel MOS transistor TP20 having the small size is connected between the power supply terminal adjacent to the boosted voltage VPP and the output node A1 of the differential amplifying circuit 31A. Moreover, the N-channel MOS transistor TN20 having the small size is connected between the power supply terminal adjacent to the grounded voltage VSS and the output node A2 of the differential amplifying circuit 31B.

Since the MOS transistors TP20 and TN20 are provided, oscillation of the output voltage VOUT can effectively be prevented and stable intermediate voltage can quickly be obtained.

In this modification, the MOS transistors TP20 and TN20 prevent delay of the feedback so as to prevent the oscillation of the output voltage VOUT. Therefore, the non-sensitive zone can be omitted when the output voltage VOUT is set. Thus, the same input voltage VB is supplied to the positive side input terminals of the differential amplifying circuits 31A and 31B to obtain predetermined output voltage VOUT.

Since the pull-down MOS transistor is provided, the incontinent MOS transistor (corresponding to the TN5 shown in FIG. 11) which is always turned on can be omitted.

Figure 22:
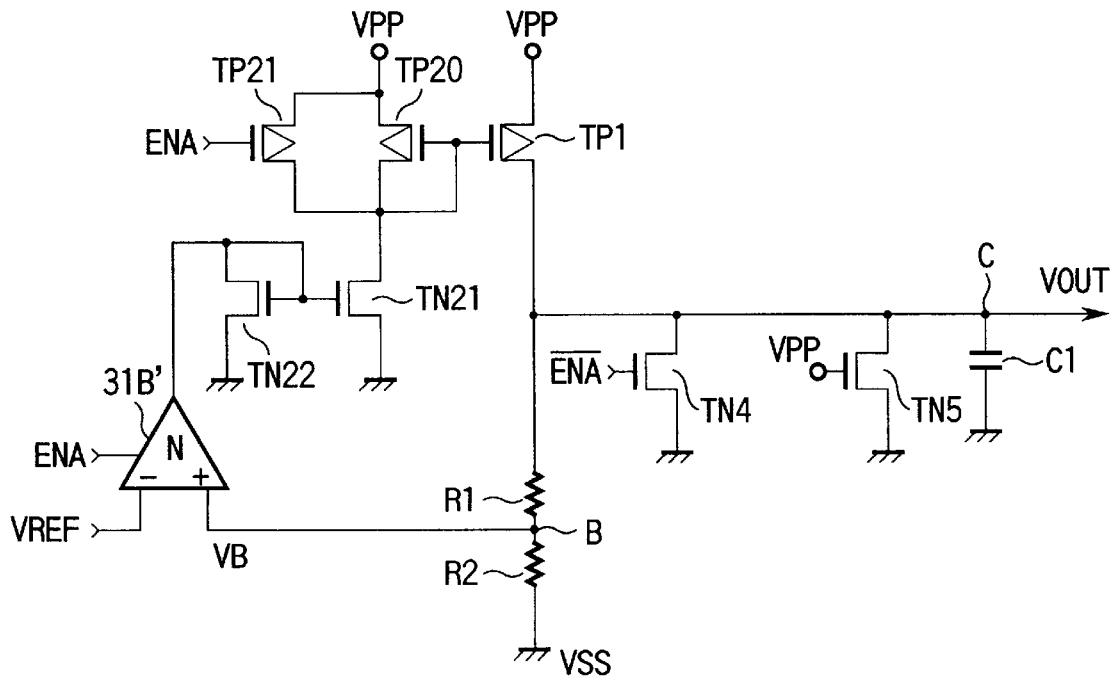
FIG. 22 is a circuit diagram showing an intermediate voltage generating circuit according to a third modification of the second embodiment of the present invention.

FIG. 22 shows a nonvolatile semiconductor memory having an intermediate voltage generating circuit according to a third modification of the second embodiment of the present invention.

The reference voltage VREF is supplied to the negative side input terminal of the current mirror differential amplifying circuit 31B', while the gate of an N-channel MOS transistor TN21 is connected to the output node of the same. An N-channel MOS transistor TN22 is connected between the power supply terminal (the grounded point) adjacent to the grounded voltage VSS and the output node of the differential amplifying circuit 31B'. The gate and drain of the MOS transistor TN22 are connected to each other.

The source of the MOS transistor TN21 is connected to the grounded point, while the gate of the pull-up P-channel MOS transistor TP1 is connected to the drain of the same. The P-channel MOS transistors TP20 and TP21 are, in parallel, connected between the power supply terminal adjacent to the boosted voltage VPP and the drain of the MOS transistor TN21. The gate and drain of the MOS transistor TP20 are connected to each other. The enable signal ENA is supplied to the gate of the MOS transistor TP21.

The source of the MOS transistor TP1 is supplied with the boosted voltage VPP of the charge pump circuit, while the drain of the same outputs the output voltage VOUT. Resistors R1 and R2 are in series connected between the drain of the MOS transistor TP1 and the grounded point. The junction B between the resistor R1 and the resistor R2 is connected to the positive side input terminal of the differential amplifying circuit 31A.

The N-channel MOS transistor TN4 is connected between the drain of the MOS transistor TP1 and the grounded point. The gate of the MOS transistor TN4 is supplied with the inverted signal $\overline{ENA}$ of the enable signal.

The N-channel MOS transistor TN5 is connected between the drain of the MOS transistor TP1 and the grounded point. The MOS transistor TN5 has relatively small size to prevent rise of the output voltage VOUT attributable to overshoot, sub-threshold leak current, the capacity coupling with the power source or the like.

The capacitor C1 is connected between the drain of the MOS transistor TP1 and the grounded point. The capacitor C1 is provided for the purpose of compensating the phase delay for the feedback loop of the differential amplifying circuit 31 so as to stabilize the output voltage VOUT.

The size (the drive force) of each of the MOS transistors TP20, TP21, TN21 and TN22 is made to be smaller than the size (the drive force) of the pull-up MOS transistor TP1.

Since the intermediate voltage generating circuit having the above-mentioned structure is provided with the P-channel MOS transistor TP20 having small size, the oscillation of the output voltage VOUT can effectively be prevented, as shown in FIG. 11. Thus, stable intermediate voltage can quickly be obtained.

Since the N-channel MOS transistors TN21 and TN22 each having small size are provided, the differential amplifying circuit 31B' can be operated by the external power source VDD in place of the boosted voltage VPP. Therefore, change of the characteristic occurring due to the deflection of the boosted voltage VPP in the case where the differential amplifying circuit 31B' is operated with the boosted voltage VPP can be prevented.

Figure 23:
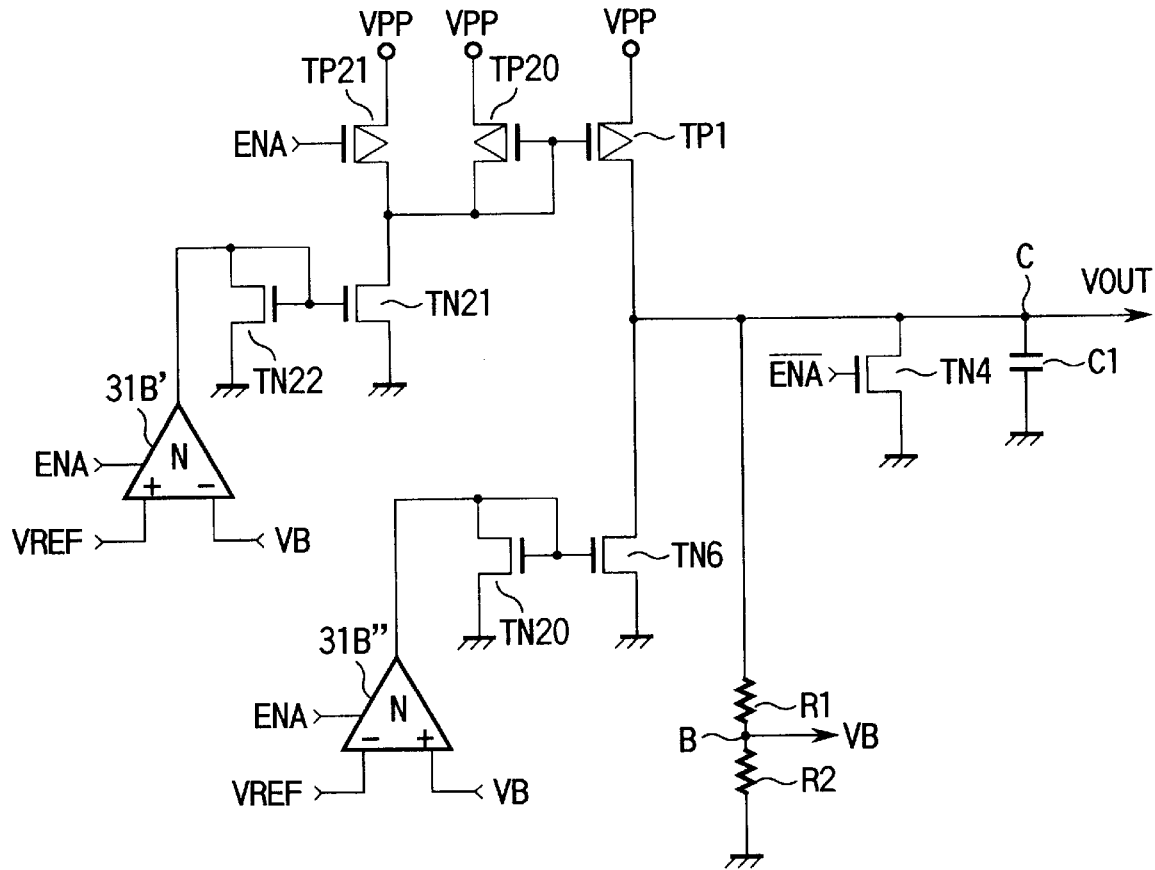
FIG. 23 is a circuit diagram showing an intermediate voltage generating circuit according to a fourth modification of the second embodiment of the present invention.

FIG. 23 shows a nonvolatile semiconductor memory having an intermediate voltage generating circuit according to a fourth modification of the second embodiment of the present invention.

The negative side input terminal of the current mirror differential amplifying circuit 31B' is supplied with the reference voltage VREF, while the gate of the N-channel MOS transistor TN21 is connected to the output node of the same. The N-channel MOS transistor TN22 is connected between the power supply terminal (the grounded point) adjacent to the grounded voltage VSS and the output node of the differential amplifying circuit 31B'. The gate and drain of the MOS transistor TN22 are connected to each other.

The source of the MOS transistor TN21 is connected to the grounded point, while the gate of the pull-up P-channel MOS transistor TP1 is connected to the drain of the same. P-channel MOS transistors TP20 and TP21 are in parallel connected between the power supply terminal adjacent to the boosted voltage VPP and the drain of the MOS transistor TN21. The gate and drain of the MOS transistor TP20 are connected to each other. The gate of the MOS transistor TP21 is supplied with the enable signal ENA.

The source of the MOS transistor TP1 is supplied with the boosted voltage VPP of the charge pump circuit, while the drain of the same outputs the output voltage VOUT.

The negative side input terminal of the current mirror differential amplifying circuit 31B" is supplied with the reference voltage VREF, while the gate of the pull-down N-channel MOS transistor TN6 is connected to the output node of the same. The N-channel MOS transistor TN20 is connected between the power supply terminal (the grounded point) adjacent to the grounded voltage VSS and the output node of the differential amplifying circuit 31B". The gate and drain of the MOS transistor TN20 are connected to each other.

The source of the MOS transistor TN6 is supplied with the grounded voltage VSS, while the drain of the same outputs the output voltage VOUT.

Resistors R1 and R2 are in series connected between the drain of each of the MOS transistors TP1 and TN6 and the grounded point. The junction B between the resistors R1 and R2 is connected to each positive side input terminal of the differential amplifying circuits 31B' and 31B".

The N-channel MOS transistor TN4 is connected between the drain of each of the MOS transistors TP1 and TN6 and the grounded point. The gate of the MOS transistor TN4 is supplied with the inverted signal $\overline{\text{ENA}}$ of the enable signal.

The capacitor C1 is connected between the drain of each of the MOS transistors TP1 and TN6 and the grounded point. The capacitor C1 is provided for the purpose of compensating the phase delay for the feedback loop of each of the differential amplifying circuits 31A and 31B so as to stabilize the output voltage VOUT.

The size (the drive force) of each of the MOS transistors TP20, TP21, TN21 and TN22 is made to be smaller than the size (the drive force) of the pull-up MOS transistor TP1. The size (the drive force) of the MOS transistor TN20 is made to be smaller than the size (the drive force) of the pull-down MOS transistor TN6.

Figure 19:
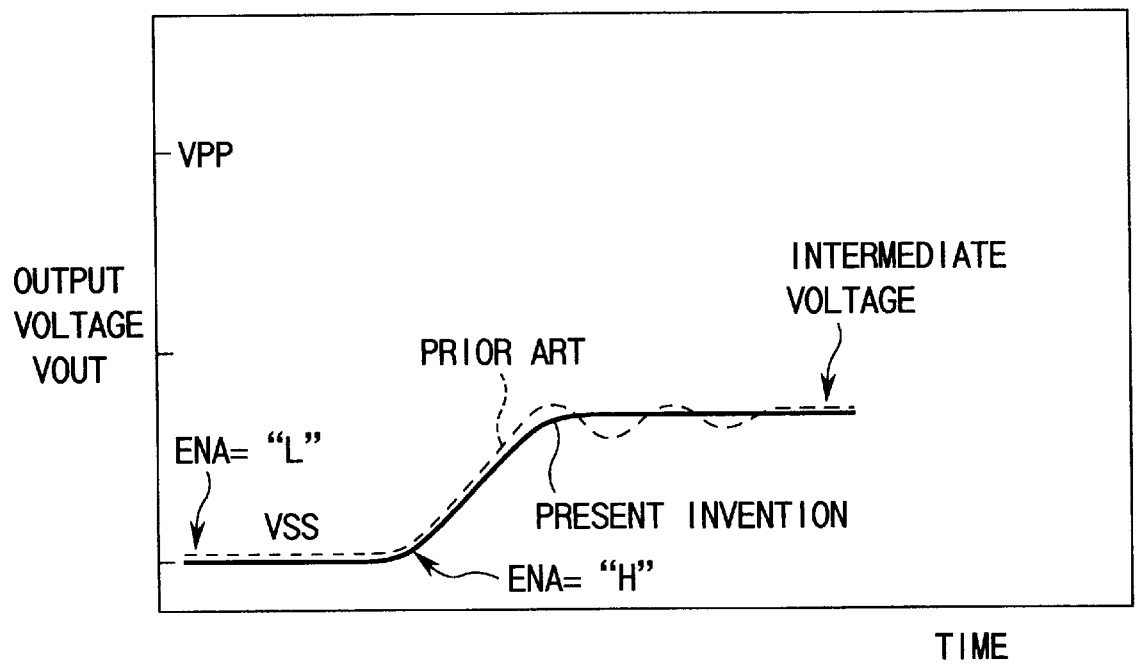
FIG. 19 is a graph showing change of the output voltage which takes place in the second embodiment of the present invention as compared with the conventional structure.

Since the intermediate voltage generating circuit having the above-mentioned structure is provided with the P-channel MOS transistors TP20 and TN20 each having the small size, the oscillation of the output voltage VOUT can effectively be prevented and thus stable intermediate voltage can quickly be obtained as shown in FIG. 19.

Since the N-channel MOS transistors TN21 and TN22 each having the small size are provided, the differential amplifying circuit 31B' can be operated by the external power source VDD in place of the boosted voltage VPP. Also the differential amplifying circuit 31B" can be operated by the external power source VDD.

Thus, the change in the characteristic occurring due to the deflection of the boosted voltage VPP when the differential amplifying circuits 31B' and 31B" are operated with the boosted voltage VPP can be prevented.

In this embodiment, the MOS transistors TP20 and TN20 prevent delay of the feedback so as to prevent oscillation of the output voltage VOUT. Therefore, the non-sensitive zone can be omitted when the output voltage VOUT is set. Thus, the same input voltage VB is applied to the positive input terminals of the differential amplifying circuits 31B' and 31B" to obtain the predetermined output voltage VOUT.

Since the pull-down MOS transistor TN6 is provided, the incontinent MOS transistor (corresponding to TN5 shown in FIG. 22) which is always turned on can be omitted.

Figure 24:
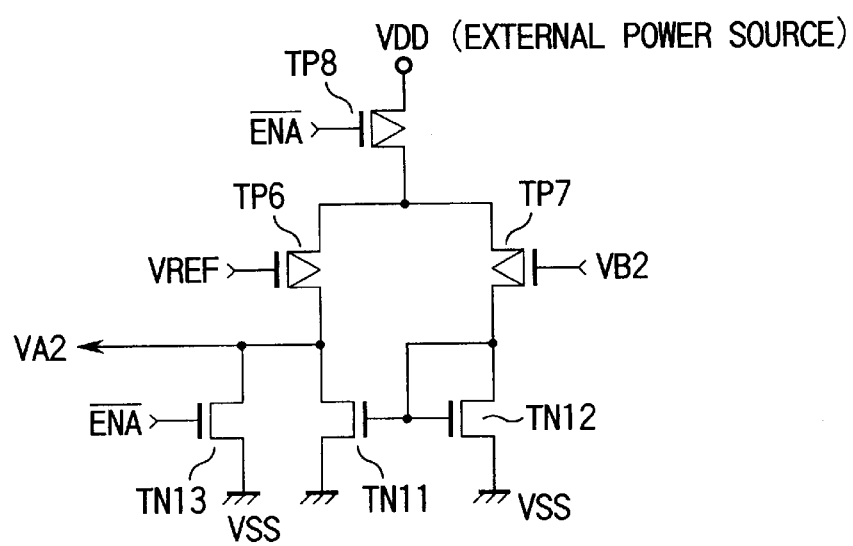
FIG. 24 is a diagram showing examples of the differential amplifying circuits 31B' and 31B" shown in FIGS. 22 and 23.

FIG. 24 shows an example of the structures of the current mirror differential amplifying circuits 31B' and 31B" shown in FIGS. 22 and 23.

Each of the differential amplifying circuits 31B' and 31B" has a current mirror circuit composed of the N-channel MOS transistor having excellent cosistency with the MOS transistors TN6 and TN21 in order to drive the N-channel MOS transistors TN6 and TN21.

That is, the source of each of the N-channel MOS transistors TN11 and TN12 is connected to the power supply terminal adjacent to the grounded voltage VSS. The gates of the MOS transistors TN11 and TN12 are connected to each other such that their junction is connected to the drain of the MOS transistor TN12.

The source of the P-channel MOS transistor TP6 is connected to the terminal for external power source VDD through the P-channel MOS transistor TP8, while the drain of the same is connected to the drain of the MOS transistor TN11. The source of the P-channel MOS transistor TP7 is connected to the terminal for the external power source VDD through the MOS transistor TP8, while the drain of the same is connected to the drain of the MOS transistor TN12.

The reference voltage VREF is applied to the gate of the MOS transistor TP6. The voltage VB at the junction B is applied to the gate of the MOS transistor TP7. The output voltage from each of the differential amplifying circuits 31B' and 31B" is output from the drain of each of the MOS transistors TP6 and TN11. The gate of each of the MOS transistors TP8 and TN13 is supplied with the inverted signal $\overline{\text{ENA}}$ of the enable signal.

Figure 25:
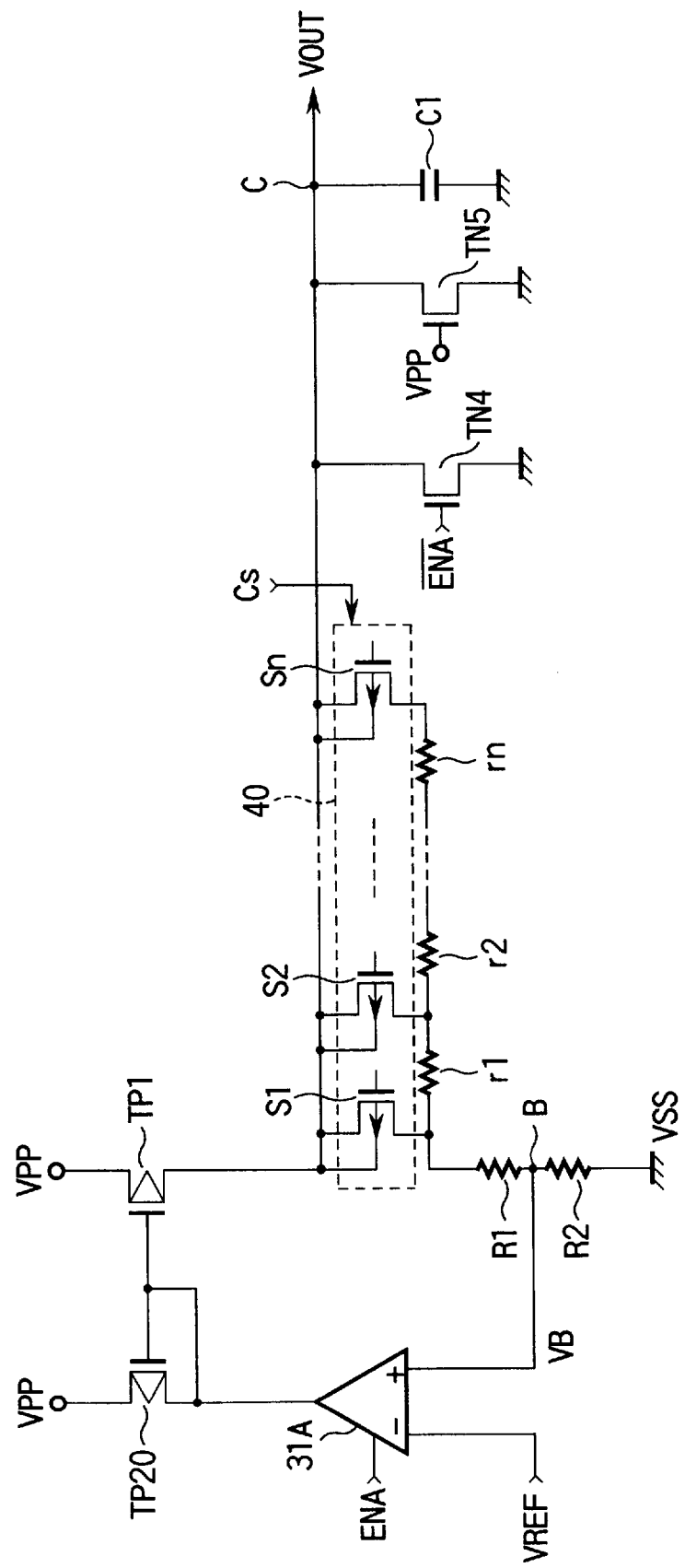
FIG. 25 is a circuit diagram showing an intermediate voltage generating circuit according to a fifth modification of the second embodiment of the present invention.

FIG. 25 shows a nonvolatile semiconductor memory having an intermediate voltage generating circuit according to a fifth modification of the second embodiment of the present invention.

The negative side input terminal of the differential amplifying circuit 31A is supplied with the reference voltage VREF, while the gate of the pull-up P-channel MOS transistor TP1 is connected to the output node of the same. The P-channel MOS transistor TP20 is connected between the power supply terminal adjacent to the boosted voltage VPP and the gate of the MOS transistor TP1. The gate and drain of the MOS transistor TP20 are connected to each other.

The source of the MOS transistor TP1 is supplied with the boosted voltage VPP of the charge pump circuit, while the drain of the same outputs the output voltage VOUT. A switch circuit 40 and resistors R1 and R2 are, in series, connected between the drain of the MOS transistor TP1 and the grounded point. The junction B between the resistor R1 and the resistor R2 is connected to the positive side input terminal of the differential amplifying circuit 31A.

The switch circuit 40 is composed of n (n is a plural number) P-channel MOS transistors S1, S2, . . . , Sn each having a source which is connected to the output node C. Resistors r1, r2, . . . , rn are connected between the drains of the MOS transistors S1, S2, . . . , Sn. The drain of the end MOS transistor S1 is connected to the resistor R1.

The operation for turning on/off each of the MOS transistors S1, S2, . . . , Sn is controlled in response to control signal Cs. The control signal Cs turns on only one of the n MOS transistors S1, S2, . . . , Sn. That is, the switch circuit 40 is able to switch the resistance ratio at the junction B. Therefore, various levels of the output voltage VOUT can be obtained by switching the resistance ratio.

When a substrate (or a well) on which the MOS transistors S1, S2, . . . , Sn are formed is connected to the output node C, change of the voltage VB at the junction B occurring due to coupling can be prevented.

The N-channel MOS transistor TN4 is connected between the drain of the MOS transistor TP1 and the grounded point. The gate of the MOS transistor TN4 is supplied with the inverted signal $\overline{ENA}$ of the enable signal.

The N-channel MOS transistor TN5 is connected between the drain of the MOS transistor TP1 and the grounded point. The MOS transistor TN5 has relatively small size to prevent rise of the output voltage VOUT occurring due to overshoot, sub-threshold leak current, the capacity coupling with the power source or the like.

The capacitor C1 is connected between the drain of the MOS transistor TP1 and the grounded point. The capacitor C1 is provided for the purpose of compensating the phase delay for the feedback loop of the differential amplifying circuit 31 so as to stabilize the output voltage VOUT.

The size (the drive force) of the MOS transistor TP20 is made to be smaller than the size (the drive force) of the pull-up MOS transistor TP1.

Since the intermediate voltage generating circuit having the above-mentioned structure is provided with the switch circuit 40, various levels of intermediate potentials can be obtained. The switch circuit 40 may be applied to all of the above-mentioned embodiments.

Since the P-channel MOS transistor TP20 having the small size is provided, oscillation of the output voltage VOUT can effectively be prevented and thus stable intermediate voltage can quickly be obtained, as shown in FIG. 12.

Figure 26:
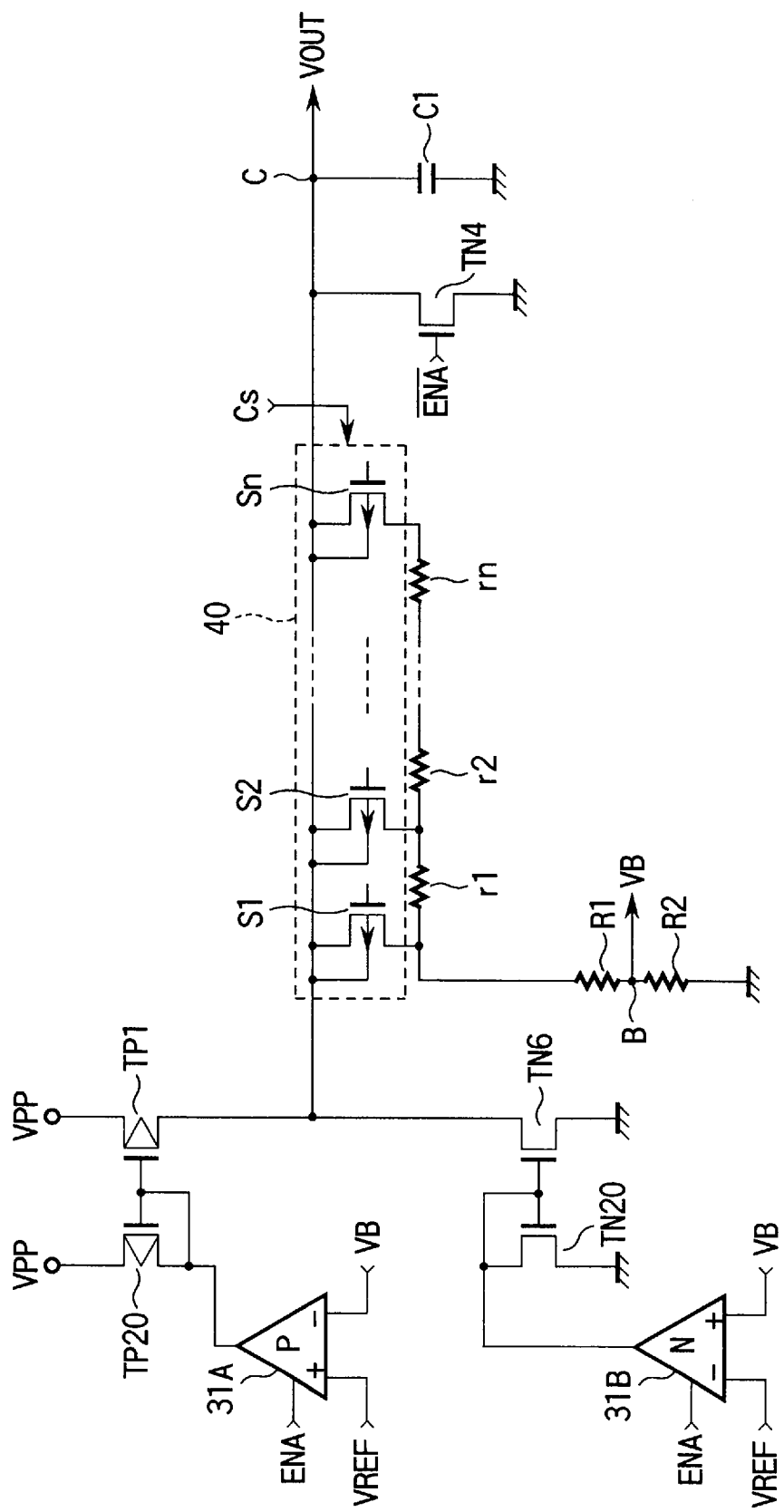
FIG. 26 is a circuit diagram showing an intermediate voltage generating circuit according to a sixth modification of the second embodiment of the present invention.

FIG. 26 shows a nonvolatile semiconductor memory having an intermediate voltage generating circuit according to a sixth modification of the second embodiment of the present invention.

The negative side input terminal of the current mirror differential amplifying circuit 31A is supplied with the reference voltage VREF, while the gate of the pull-up P-channel MOS transistor TP1 is connected to the output node of the same. The P-channel MOS transistor TP20 is connected between the power supply terminal adjacent to the boosted voltage VPP and the gate of the MOS transistor TP1. The gate and drain of the MOS transistor TP20 are connected to each other.

The source of the MOS transistor TP1 is applied with the boosted voltage VPP of the charge pump circuit, while the drain of the same outputs the output voltage VOUT.

The negative side input terminal of the current mirror differential amplifying circuit 31B is supplied with the reference voltage VREF, while the gate of the pull-down N-channel MOS transistor TN6 is connected to the output node of the same. The N-channel MOS transistor TN20 is connected between the power supply terminal (the grounded point) adjacent to the grounded voltage VSS and the output node of the differential amplifying circuit 31B. The gate and drain of the MOS transistor TN20 are connected to each other.

The source of the MOS transistor TN6 is supplied with the grounded voltage VSS, while the drain of the same outputs the output voltage VOUT.

The switch circuit 40 and resistors R1 and R2 are, in series, connected between the drain of each of the MOS transistors TP1 and TN6 and the grounded point. The junction B between the resistor R1 and the resistor R2 is connected to the positive side input terminal of each of the differential amplifying circuits 31A and 31B.

The switch circuit 40 is composed of n (n is a plural number) P-channel MOS transistors S1, S2, . . . , Sn each having the source connected to the output node C. The resistors r1, . . . , r2, . . . , rn are connected between the drains of the MOS transistors S1, S2, . . . , Sn. The drain of the end MOS transistor S1 is connected to the resistor R1.

The operation for turning on/off each of the MOS transistors S1, S2, . . . , Sn is controlled in response to the control signal Cs. The control signal Cs turns on only one of the n MOS transistors S1, S2, . . . , Sn. That is, the switch circuit 40 is able to switch the resistance ratio at the junction B. Therefore, various levels of the output voltage VOUT can be obtained by switching the resistance ratio.

When a substrate (or a well) on which the MOS transistors S1, S2, . . . , Sn are formed is connected to the output node C, change of the voltage VB at the junction B occurring due to coupling can be prevented.

The N-channel MOS transistor TN4 is connected between the drain of each of the MOS transistors TP1 and TN6 and the grounded point. The gate of the MOS transistor TN4 is supplied with the inverted signal $\overline{ENA}$ of the enable signal.

The capacitor C1 is connected between the drain of each of the MOS transistors TP1 and TN6 and the grounded point. The capacitor C1 is provided for the purpose of compensating the phase delay for the feedback loop of each of the differential amplifying circuits 31A and 31B so as to stabilize the output voltage VOUT.

The size (the drive force) of the MOS transistor TP20 is made to be smaller than the size (the drive force) of the pull-up MOS transistor TP1. The size (the drive force) of the MOS transistor TN20 is made to be smaller than the size (the drive force) of the pull-down MOS transistor TN6.

Since the intermediate voltage generating circuit having the above-mentioned structure is provided with the switch circuit 40, various levels of intermediate potentials can be obtained. The switch circuit 40 may be applied to all of the above-mentioned embodiments.

Since the P-channel MOS transistors TP20 and TN20 each having the small size is provided, oscillation of the output voltage VOUT can effectively be prevented and thus stable intermediate voltage can quickly be obtained, as shown in FIG. 19.

In this modification, the MOS transistors TP20 and TN20 prevent delay of the feedback and oscillation of the output voltage VOUT. Therefore, the non-sensitive zone can be omitted when the output voltage VOUT is set. Thus, the same input voltage VB can be applied to the positive input terminals of the differential amplifying circuits 31A and 31B to obtain the predetermined output voltage VOUT.

Since the pull-down MOS transistor TN6 is provided, the incontinent MOS transistor (corresponding to TN5 shown in FIG. 25) which is always turned on can be omitted.

Figure 27:
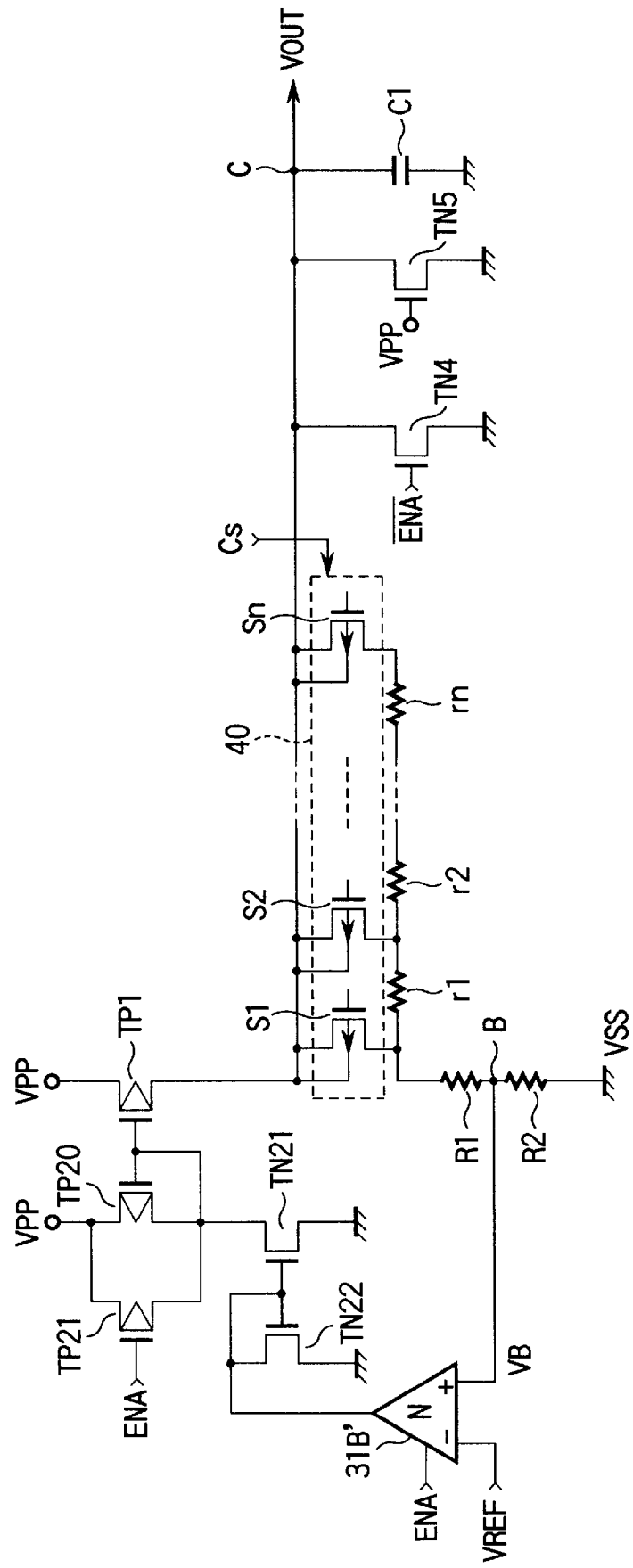
FIG. 27 is a circuit diagram showing an intermediate voltage generating circuit according to a seventh modification of the second embodiment of the present invention.

FIG. 27 shows a nonvolatile semiconductor memory having an intermediate voltage generating circuit according to a seventh modification of the second embodiment of the present invention.

The negative side input terminal of the current mirror differential amplifying circuit 31B' is supplied with the reference voltage VREF, while the gate of the N-channel MOS transistor TN21 is connected to the output node of the same. An N-channel MOS transistor TN22 is connected between the power supply terminal (the grounded point) adjacent to the grounded voltage VSS and the output node of the differential amplifying circuit 31B'. The gate and drain of the MOS transistor TN22 are connected to each other.

The source of the MOS transistor TN21 is connected to the grounded point, while the gate of the pull-up P-channel MOS transistor TP1 is connected to the drain of the same. The P-channel MOS transistors TP20 and TP21 are, in parallel, connected between the power supply terminal adjacent to the boosted voltage VPP and the drain of the MOS transistor TN21. The gate and drain of the MOS transistor TP20 are connected to each other. The gate of the MOS transistor TP21 is supplied with the enable signal ENA.

The source of the MOS transistor TP1 is applied with the boosted voltage VPP of the charge pump circuit, while the drain of the same outputs the output voltage VOUT. The switch circuit 40 and resistors R1 and R2 are, in series, connected between the drain of the MOS transistor TP1 and the grounded point. The junction B between the resistor R1 and the resistor R2 is connected to the positive side input terminal of the differential amplifying circuit 31A.

The switch circuit 40 is composed of n (n is a plural number) P-channel MOS transistors S1, S2, ..., Sn each having a drain which is connected to the output node C. Resistors r1, r2, ..., rn are connected between the sources of the MOS transistors S1, S2, ..., Sn. The source of the end MOS transistor S1 is connected to the resistor R1.

The operation for turning on/off each of the MOS transistors S1, S2, ..., Sn is controlled in response to control signal Cs. The control signal Cs turns on only one of the n MOS transistors S1, S2, ..., Sn. That is, the switch circuit 40 is able to switch the resistance ratio at the junction B. Therefore, various levels of the output voltage VOUT can be obtained by switching the resistance ratio.

When a substrate (or a well) on which the MOS transistors S1, S2, ..., Sn are formed is connected to the output node C, change of the voltage VB at the junction B occurring due to coupling can be prevented.

The N-channel MOS transistor TN4 is connected between the drain of the MOS transistor TP1 and the grounded point. The gate of the MOS transistor TN4 is supplied with the inverted signal $\overline{ENA}$ of the enable signal.

The N-channel MOS transistor TN5 is connected between the drain of the MOS transistor TP1 and the grounded point. The MOS transistor TN5 has relatively small size to prevent rise of the output voltage VOUT occurring due to overshoot, sub-threshold leak current, the capacity coupling with the power source or the like.

The capacitor C1 is connected between the drain of the MOS transistor TP1 and the grounded point. The capacitor C1 is provided for the purpose of compensating the phase delay for the feedback loop of the differential amplifying circuit 31 so as to stabilize the output voltage VOUT.

The size (the drive force) of each of the MOS transistors TP20, TP21, TN21 and TN22 is made to be smaller than the size (the drive force) of the pull-up MOS transistor TP1.

Since the intermediate voltage generating circuit having the above-mentioned structure is provided with the switch circuit 40, various levels of intermediate potentials can be obtained. The switch circuit 40 may be applied to all of the above-mentioned embodiments.

Since the P-channel MOS transistor TP20 having the small size is provided, oscillation of the output voltage VOUT can effectively be prevented and thus stable intermediate voltage can quickly be obtained, as shown in FIG. 19.

Since the N-channel MOS transistors TN21 and TN22 each having the small size are provided, the differential amplifying circuit 31B' can be operated by the external power source VDD in place of the boosted voltage VPP. Thus, change of the characteristic occurring due to deflection of the boosted voltage VPP when the differential amplifying circuit 31B' is operated with the boosted voltage VPP can be prevented.

Figure 28:
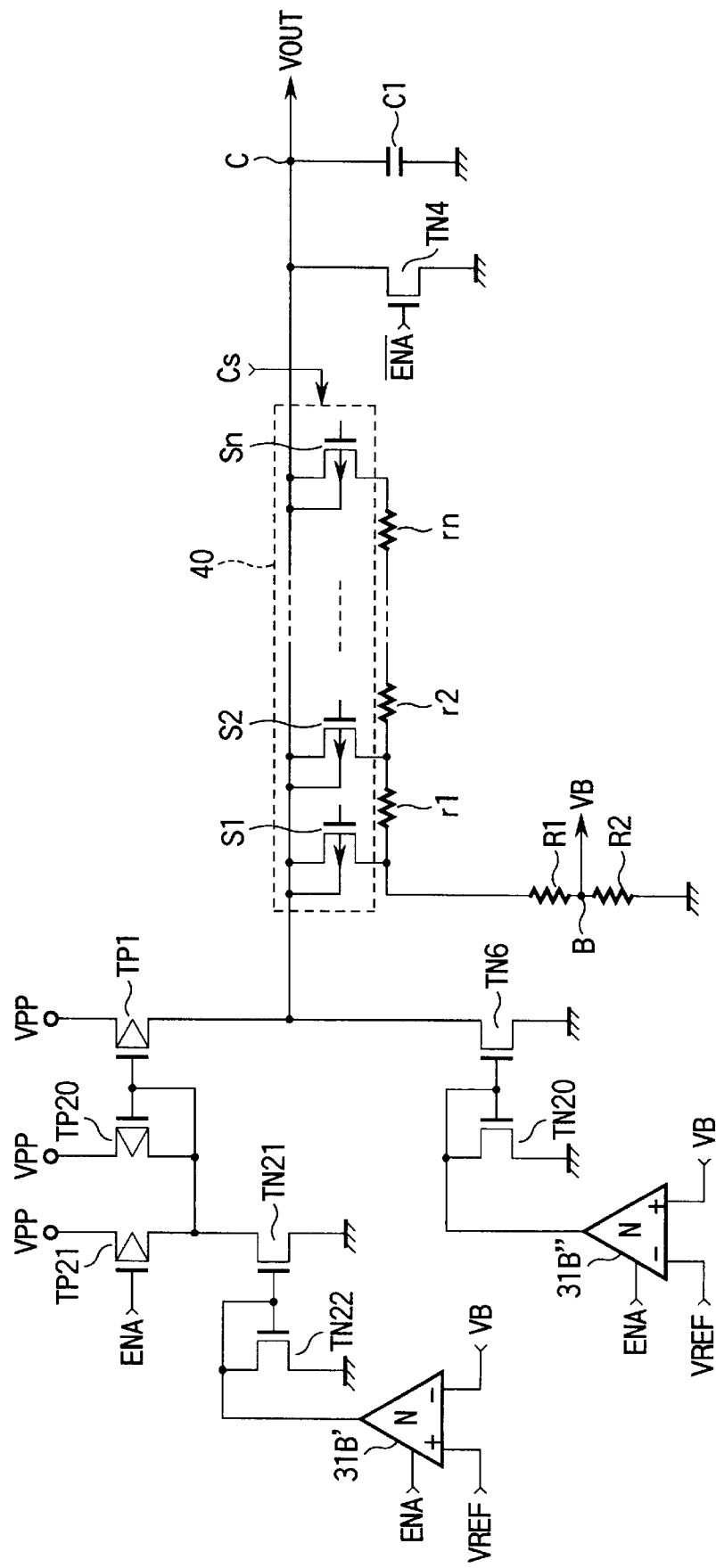
FIG. 28 is a circuit diagram showing an intermediate voltage generating circuit according to an eighth modification of the second embodiment of the present invention.

FIG. 28 shows a nonvolatile semiconductor memory having an intermediate voltage generating circuit according to an eighth modification of the second embodiment of the present invention.

The negative side input terminal of the current mirror differential amplifying circuit 31B' is supplied with the reference voltage VREF, while the gate of the N-channel MOS transistor TN21 is connected to the output node of the same. An N-channel MOS transistor TN22 is connected between the power supply terminal (the grounded point) adjacent to the grounded voltage VSS and the output node of the differential amplifying circuit 31B'. The gate and drain of the MOS transistor TN22 are connected to each other.

The source of the MOS transistor TN21 is connected to the grounded point, while the gate of the pull-up P-channel MOS transistor TP1 is connected to the drain of the same. The P-channel MOS transistors TP20 and TP21 are, in parallel, connected between the power supply terminal adjacent to the boosted voltage VPP and the drain of the MOS transistor TN21. The gate and drain of the MOS transistor TP20 are connected to each other. The gate of the MOS transistor TP21 is supplied with the enable signal ENA.

The source of the MOS transistor TP1 is applied with the boosted voltage VPP of the charge pump circuit, while the drain of the same outputs the output voltage VOUT.

The negative side input terminal of the current mirror differential amplifying circuit 31B" is supplied with the reference voltage VREF, while the gate of the pull-down N-channel MOS transistor TN6 is connected to the output node of the same. The N-channel MOS transistor TN20 is connected between the power supply terminal (the grounded point) adjacent to the grounded voltage VSS and the output node of the differential amplifying circuit 31B". The gate and drain of the MOS transistor TN20 are connected to each other.

The source of the MOS transistor TN6 is applied with the grounded voltage VSS, while the drain of the same outputs the output voltage VOUT.

The switch circuit 40 and resistors R1 and R2 are, in series, connected between the drain of each of the MOS transistors TP1 and TN6 and the grounded point. The junction B between the resistor R1 and the resistor R2 is connected to the positive side input terminal of each of the differential amplifying circuits 31B' and 31B".

The switch circuit 40 is composed of n (n is a plural number) P-channel MOS transistors S1, S2, . . . , Sn each having a drain which is connected to the output node C. Resistors r1, r2, . . . , rn are connected between the sources of the MOS transistors S1, S2, . . . , Sn. The source of the MOS transistor Si is connected to the resistor R1.

The operation for turning on/off each of the MOS transistors S1, S2, . . . , Sn is controlled in response to control signal Cs. The control signal Cs turns on only one of the n MOS transistors S1, S2, . . . , Sn. That is, the switch circuit 40 is able to switch the resistance ratio at the junction B. Therefore, various levels of the output voltage VOUT can be obtained by switching the resistance ratio.

When a substrate (or a well) on which the MOS transistors S1, S2, . . . , Sn are formed is connected to the output node C, change of the voltage VB at the junction B occurring due to coupling can be prevented.

The N-channel MOS transistor TN4 is connected between the drain of each of the MOS transistors TP1 and TN6. The gate of the MOS transistor TN4 is supplied with the inverted signal $\overline{ENA}$ of the enable signal.

The capacitor C1 is connected between the drain of each of the MOS transistors TP1 and TN6 and the grounded point. The capacitor C1 is provided for the purpose of compensating the phase delay for the feedback loop of each of the differential amplifying circuits 31A and 31B so as to stabilize the output voltage VOUT.

The size (the drive force) of each of the MOS transistors TP20, TP21, TN21 and TN22 is made to be smaller than the size (the drive force) of the pull-up MOS transistor TP1. The size (the drive force) of the MOS transistor TN20 is made to be smaller than the size (the drive force) of the pull-down MOS transistor TN6.

Since the intermediate voltage generating circuit having the above-mentioned structure is provided with the switch circuit 40, various levels of intermediate potentials can be obtained. The switch circuit 40 may be applied to all of the above-mentioned embodiments.

Since the P-channel MOS transistors TP20 and TN20 each having the small size is provided, oscillation of the output voltage VOUT can effectively be prevented and thus stable intermediate voltage can quickly be obtained, as shown in FIG. 19.

Since the N-channel MOS transistors TN21 and TN22 each having the small size are provided, the differential amplifying circuit 31B' can be operated by the external power source VDD in place of the boosted voltage VPP. Also the differential amplifying circuit 31B" can be operated with the external power source VDD.

Thus, change of the characteristic occurring due to deflection of the boosted voltage VPP when the differential amplifying circuits 31B' and 31B" is operated with the boosted voltage VPP can be prevented.

In this embodiment, the MOS transistors TP20 and TN20 prevent delay of the feedback to prevent oscillation of the output voltage VOUT. Therefore, when the output voltage VOUT is set, the non-sensitive zone can be omitted. Thus, the same input voltage VB can be applied to the positive side input terminals of the differential amplifying circuits 31B' and 31B" to obtain the predetermined output voltage VOUT.

Since the pull-down MOS transistor TN6 is provided, the incontinent MOS transistor (corresponding to TN5 shown in FIG. 27) which is always turned on may be omitted.

Figure 29:
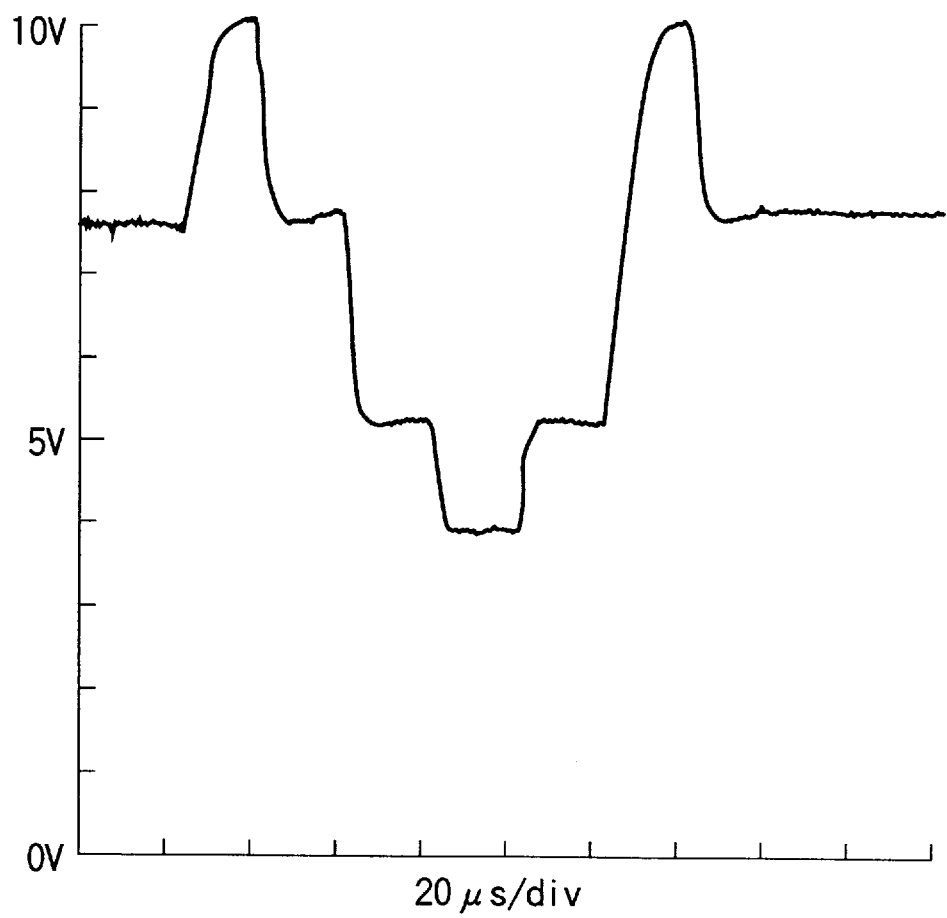
FIG. 29 is a graph showing a result of a simulation of the change of the output voltage.

FIG. 29 shows a result of simulation of various output voltage levels obtained by the switching operation performed by the switch circuit of the intermediate voltage generating circuit having the switch circuit shown in FIGS. 25 to 28.

In this simulation operation, the voltage Vg of the word line is changed in the sequential order as 7.5 V (program verify (P.V))→10 V (program (Prog.))→7.5 V (P.V)→5 V (inhibition (Inhi.))→3.5 V (erase and verify (E.V))→5 V (Inhi.)→10 V (Prog.)→7.5 V (P.V).

As can be understood from the result of the simulation, the second embodiment of the present invention arranged as shown in FIGS. 11, 14 to 16, 18 and 19 is able to prevent oscillation of the output voltage VOUT occurring when the output voltage VOUT is changed. Thus, predetermined voltage can quickly and stably be obtained.

As described above, the nonvolatile semiconductor memory according to the present invention attains the following effects.

According to the first embodiment of the present invention, the pull-down N-channel MOS transistor for discharging the charge of the output node is provided in addition to the pull-up P-channel MOS transistor for supplying a charge to the output node.

The pull-down N-channel MOS transistor is controlled to rapidly lower the voltage (the boosted voltage VPP) at the output node and to maintain the state where it is turned off until the voltage at the output node is stabilized to a predetermined level if the voltage at the output node is made to be lower than a predetermined level.

Therefore, the time required for the voltage at the output node to be stabilized from the boosted voltage VPP to a predetermined output voltage VOUT level can significantly be shortened.

Since the pull-down N-channel MOS transistor is provided, the level of the resistor for determining the positive side input voltage for the differential amplifying circuit can be raised. Thus, the electric current which flows to the grounded point through the resistor can be lowered. As a result, the electric power consumption when the output voltage VOUT is in the stabled state can be reduced.

The pull-down N-channel MOS transistor interrupts its operation for lowering the voltage of the output node when the output voltage VOUT has been lowered to a predetermined voltage level. Therefore, the voltage of the output node is controlled only by the pull-up P-channel MOS transistor. Therefore, oscillation of the output voltage VOUT can effectively be prevented.

As described above, according to the first embodiment of the present invention, the requirement for reducing the electric power consumption and the requirement for raising the operation speed can simultaneously be satisfied.

The second embodiment of the present invention has the structure such that the small MOS transistor having the gate and drain which are connected to each other is connected between the power supply terminal adjacent to the boosted voltage VPP and the gate of the pull-up P-channel MOS transistor.

Therefore, delay occurring due to the gate capacity of the pull-up P-channel MOS transistor can be reduced and the feedback speed of the differential amplifying circuit can be raised. Therefore, when the output voltage is switched, oscillation of the output voltage can be prevented and a constant voltage level can quickly and stably be output.

When the pull-down N-channel MOS transistor is provided, the small MOS transistor having the gate and drain, which are connected to each other, is connected between the power supply terminal adjacent to the grounded voltage VSS and the gate of the pull-down N-channel MOS transistor. Therefore, delay occurring due to the gate capacity of the pull-down N-channel MOS transistor can be reduced and oscillation of the output voltage can be prevented.

When the level of the output voltage from the differential amplifying circuit is sequentially shifted to be supplied to the pull-up MOS transistor, the differential amplifying circuit can be operated with the external power source VDD.

Since the division ratio of the resistor for determining the feedback voltage for the differential amplifying circuit is switched, various levels of intermediate voltage (the output voltage) can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An intermediate voltage generating circuit comprising:
   first voltage-dividing means for dividing an output voltage from an output node at a predetermined ratio;
   a first differential amplifying circuit for receiving a reference voltage and a voltage divided by said first voltage-dividing means;
   second voltage-dividing means for dividing the output voltage from said output node at a predetermined ratio;
   a second differential amplifying circuit for receiving said reference voltage and voltage divided by said second voltage-dividing means;
   a first terminal to which is applied a first voltage;
   a first MOS transistor of a first conductive type having a source connected to said first terminal, a drain connected to said output node and a gate to which the output voltage from said first differential amplifying circuit is applied;
   a second terminal to which is applied a second voltage; and
   a second MOS transistor of a second conductive type different than said first type having a source connected to said second terminal, a drain connected to said output node and a gate to which the output voltage from said second differential amplifying circuit is applied.

2. An intermediate voltage generating circuit according to claim 1, further comprising:
   means for changing the ratio of division of the voltage which is performed by said second voltage-dividing means to inhibit said second MOS transistor to be again turned on after the output voltage from said second differential amplifying circuit has been supplied and thus the second MOS transistor has been turned off.

3. An intermediate voltage generating circuit according to claim 1, further comprising:
   means for turning said first MOS transistor on, turning said second MOS transistor off and deactivating said first voltage-dividing means and said second voltage-dividing means to set said output node to be said first voltage in a standby mode, and
   activating said first voltage-dividing means and said second voltage-dividing means and operating said first MOS transistor in accordance with the output voltage from said first differential amplifying circuit to operate said second MOS transistor in accordance with the output voltage from said second differential amplifying circuit when an intermediate voltage is generated.

4. An intermediate voltage generating circuit according to claim 1, further comprising:
   means connected between said output node and said second terminal and arranged not to be operated in the standby mode and to be operated as a constant current source when intermediate voltage is generated.

5. An intermediate voltage generating circuit according to claim 1, wherein
   when said first voltage is a boosted voltage obtained by boosting the external power supply voltage, said second voltage is a grounded voltage, said first MOS transistor is a P-channel MOS transistor and said second MOS transistor is an N-channel MOS transistor,
   said first differential amplifying circuit has a current mirror circuit composed of a P-channel MOS transistor and said second differential amplifying circuit has a current mirror circuit composed of an N-channel MOS transistor.

6. An intermediate voltage generating circuit comprising:
   voltage dividing means for dividing, into a plurality of levels, an output voltage from an output node at a predetermined ratio;
   a first differential amplifying circuit for receiving a reference voltage and one of the voltage levels divided by said voltage-dividing means;
   a second differential amplifying circuit for receiving said reference voltage and another voltage level divided by said voltage-dividing means;
   a first terminal to which is applied a first voltage;
   a first MOS transistor of a first conductive type having a source connected to said first terminal, a drain connected to said output node and a gate to which the output voltage from said first differential amplifying circuit is applied;
   a second terminal to which is applied a second voltage; and
   a second MOS transistor of a second conductive type different than said first type having a source connected to said second terminal, a drain connected to said output node and a gate to which the output voltage from said second differential amplifying circuit is applied.

7. An intermediate voltage generating circuit according to claim 6, further comprising:
   means for turning both of said first MOS transistor and said second MOS transistor off and setting said output node to be said second voltage in a standby mode, and
   operating said first MOS transistor in accordance with the output voltage from said first differential amplifying circuit to operate said second MOS transistor in accordance with the output voltage from said second differential amplifying circuit when an intermediate voltage is generated.

8. An intermediate voltage generating circuit according to claim 6, wherein
   when said first voltage level is a boosted voltage obtained by boosting the external power supply voltage, said second voltage is a grounded voltage, said first MOS transistor is a P-channel MOS transistor and said second MOS transistor is an N-channel MOS transistor,
   said first differential amplifying circuit has a current mirror circuit composed of a P-channel MOS transistor and said second differential amplifying circuit has a current mirror circuit composed of an N-channel MOS transistor.

9. An intermediate voltage generating circuit according to claim 6, further comprising:

a capacitor connected between said output node and said second terminal.

10. An intermediate voltage generating circuit comprising:

voltage dividing means for dividing output voltage from an output node at a predetermined ratio;

a differential amplifying circuit for receiving a reference voltage and a voltage divided by said voltage dividing means;

a first terminal to which is applied a first voltage;

a second terminal to which is applied a second voltage;

a first MOS transistor having a source connected to said first terminal, a drain connected to said output node and a gate to which the output voltage from said differential amplifying circuit is applied; and a second MOS transistor having a size smaller than that of said first MOS transistor and provided with a source connected to said first terminal, and a gate and a drain which are connected to said gate of said first MOS transistor.

11. An intermediate voltage generating circuit according to claim 10, further comprising:

means for turning said first MOS transistor off and setting said output node to be said second voltage in a standby mode, and operating said first MOS transistor in accordance with the output voltage from said first differential amplifying circuit when intermediate voltage is generated.

12. An intermediate voltage generating circuit according to claim 10, wherein when said first voltage is a boosted voltage obtained by boosting the external power supply voltage, said second voltage is a grounded voltage and said first MOS transistor is a P-channel MOS transistor, said differential amplifying circuit has a current mirror circuit composed of a P-channel MOS transistor.

13. An intermediate voltage generating circuit according to claim 10, further comprising:

means connected between said output node and said second terminal and arranged to be operated as a constant current source.

14. An intermediate voltage generating circuit according to claim 10, further comprising:

a capacitor connected between said output node and said second terminal.

15. An intermediate voltage generating circuit according to claim 10, further comprising:

switch means for switching a switch in accordance with a control signal to change the ratio of voltage division which is performed by said voltage dividing means so as to output, from said output node, the output voltage in accordance with the ratio of the voltage division performed by said voltage dividing means.

16. An intermediate voltage generating circuit according to claim 15, wherein said switch means has a plurality of switching MOS transistors formed in a semiconductor substrate set to the same voltage level as that of said output node and each having a source connected to said output node and a gate to which said control signal is supplied, and a plurality of resistors each of which is connected between drains of said switching MOS transistors, and an end resistor among said plural resistors is connected to said voltage dividing means.

17. An intermediate voltage generating circuit comprising:

voltage dividing means for dividing output voltage from an output node at a predetermined ratio;

first and second differential amplifying circuits for receiving a reference voltage and a voltage divided by said voltage dividing means;

a first terminal to which is applied a first voltage;

a first MOS transistor having a source connected to said first terminal, a drain connected to said output node and a gate to which the output voltage from said first differential amplifying circuit is applied;

a second terminal to which is applied a second voltage;

a second MOS transistor having a source connected to said second terminal, a drain connected to said output node and a gate to which the output voltage from said second differential amplifying circuit is applied;

a third MOS transistor having a size smaller than that of said first MOS transistor and provided with a source connected to said first terminal and a gate and a drain which are connected to said gate of said first MOS transistor; and a fourth MOS transistor having a size smaller than that of said second MOS transistor and provided with a source connected to said second terminal and a gate and a drain which are connected to said gate of said second MOS transistor.

18. An intermediate voltage generating circuit according to claim 17, further comprising:

means for turning both of said first MOS transistor and said second MOS transistor off and setting said output node to be said second voltage in a standby mode, and operating said first MOS transistor in accordance with the output voltage from said first differential amplifying circuit and operating said second MOS transistor in accordance with the output voltage from said second differential amplifying circuit when an intermediate voltage is generated.

19. An intermediate voltage generating circuit according to claim 17, wherein when said first voltage is a boosted voltage obtained by boosting the external power supply voltage, said second voltage is a grounded voltage, said first MOS transistor is a P-channel MOS transistor and said second MOS transistor is an N-channel MOS transistor, said first differential amplifying circuit has a current mirror circuit composed of a N-channel MOS transistor and said second differential amplifying circuit has a current mirror circuit composed of an N-channel MOS transistor.

20. An intermediate voltage generating circuit according to claim 17, further comprising:

a capacitor connected between said output node and said second terminal.

21. An intermediate voltage generating circuit according to claim 17, further comprising:

switch means for switching a switch in accordance with a control signal to change the ratio of voltage division which is performed by said voltage dividing means so as to output, from said output node, the output voltage in accordance with the ratio of the voltage division performed by said voltage dividing means.

22. An intermediate voltage generating circuit according to claim 21, wherein said switch means has a plurality of switching MOS transistors formed in a semiconductor substrate set to the same voltage level as that of said output node and each having a source connected to said output node and a gate to which said control signal is supplied, and a plurality of resistors each of which is connected between drains of said switching MOS transistors, and an end resistor among said plural resistors is connected to said voltage dividing means.

23. An intermediate voltage generating circuit comprising:

voltage dividing means for dividing an output voltage from an output node at a predetermined ratio;

a differential amplifying circuit for receiving a reference voltage and a voltage divided by said voltage dividing means;

a first terminal to which is applied a first voltage;

a second terminal to which is applied a second voltage;

a first MOS transistor having a source connected to said first terminal and a drain connected to said output node;

a second MOS transistor having a size smaller than that of said first MOS transistor and provided with a source connected to said first terminal and a gate and a drain which are connected to said gate of said first MOS transistor; and a third MOS transistor having a size smaller than that of said first MOS transistor and provided with a source connected to said second terminal, a drain connected to said gate of said first MOS transistor and a gate to which the output voltage from said differential amplifying circuit is applied.

24. An intermediate voltage generating circuit according to claim 23, further comprising:

a fourth MOS transistor having a size smaller than that of said first MOS transistor, and provided with a source connected to said second terminal and a gate and a drain which are connected to said gate of said third MOS transistor.

25. An intermediate voltage generating circuit according to claim 23, further comprising:

means for turning said first MOS transistor off and setting said output node to be said second voltage in a standby mode, and operating said first MOS transistor in accordance with the output voltage from said first differential amplifying circuit when an intermediate voltage is generated.

26. An intermediate voltage generating circuit according to claim 23, wherein when said first voltage is a boosted voltage obtained by boosting the external power supply voltage, said second voltage is a grounded voltage, said first MOS transistor is a P-channel MOS transistor and said third MOS transistor is an N-channel MOS transistor, said differential amplifying circuit has a current mirror circuit composed of an N-channel MOS transistor.

27. An intermediate voltage generating circuit according to claim 26, wherein said differential amplifying circuit is operated with said external power supply voltage.

28. An intermediate voltage generating circuit according to claim 23, further comprising:

means connected between said output node and said second terminal and arranged to be operated as a constant current source.

29. An intermediate voltage generating circuit according to claim 23, further comprising:

a capacitor connected between said output node and said second terminal.

30. An intermediate voltage generating circuit according to claim 23, further comprising:

switch means for switching a switch in accordance with a control signal to change the ratio of voltage division which is performed by said voltage dividing means so as to output, from said output node, the output voltage in accordance with the ratio of the voltage division performed by said voltage dividing means.

31. An intermediate voltage generating circuit according to claim 30, wherein said switch means has a plurality of switching MOS transistors formed in a semiconductor substrate set to the same voltage level as that of said output node and each having a source connected to said output node and a gate to which said control signal is supplied, and a plurality of resistors each of which is connected between drains of said switching MOS transistors, and an end resistor among said plural resistors is connected to said voltage dividing means.

32. An intermediate voltage generating circuit comprising:

voltage dividing means for dividing output voltage from an output node at a predetermined ratio;

first and second differential amplifying circuits for receiving a reference voltage and a voltage divided by said voltage dividing means;

a first terminal to which is applied a first voltage;

a first MOS transistor having a source connected to said first terminal and a drain connected to said output node;

a second terminal to which is applied a second voltage;

a second MOS transistor having a source connected to said second terminal and a drain connected to said output node;

a third MOS transistor having a size smaller than that of said first MOS transistor and provided with a source connected to said first terminal and a gate and a drain which are connected to said gate of said first MOS transistor;

a fourth MOS transistor having a size smaller than that of said first MOS transistor and provided with a source connected to said second terminal, a drain connected to said gate of said first MOS transistor and a gate to which the output voltage from said first differential amplifying circuit is applied; and a fifth MOS transistor having a size smaller than that of said second MOS transistor and provided with a source connected to said second terminal and a gate and a drain which are connected to said gate of said second MOS transistor.

33. An intermediate voltage generating circuit according to claim 32, further comprising:

a sixth MOS transistor having a size smaller than that of said first MOS transistor and provided with a source connected to said second terminal and a gate and a drain which are connected to said gate of said fourth MOS transistor.

34. An intermediate voltage generating circuit according to claim 32, further comprising:

means for turning both of said first MOS transistor and said second MOS transistor off and setting said output node to be said second voltage in a standby mode, and operating said first MOS transistor in accordance with the output voltage from said first differential amplifying circuit and operating said second MOS transistor in accordance with the output voltage from said second differential amplifying circuit when an intermediate voltage is generated.

35. An intermediate voltage generating circuit according to claim 32, wherein when said first voltage is a boosted voltage obtained by boosting the external power supply voltage, said second voltage is a grounded voltage, said first MOS transistor is a P-channel MOS transistor and said second and fourth MOS transistors are N-channel MOS transistors, each of said first and second differential amplifying circuits has a current mirror circuit composed of an N-channel MOS transistor.

36. An intermediate voltage generating circuit according to claim 35, wherein both of said first and second differential amplifying circuits are operated with said external power supply voltage.

37. An intermediate voltage generating circuit according to claim 32, further comprising:

a capacitor connected between said output node and said second terminal.

38. An intermediate voltage generating circuit according to claim 32, further comprising:

switch means for switching a switch in accordance with a control signal to change the ratio of voltage division which is performed by said voltage dividing means so as to output, from said output node, the output voltage in accordance with the ratio of the voltage division performed by said voltage dividing means.

39. An intermediate voltage generating circuit according to claim 38, wherein said switch means has a plurality of switching MOS transistors formed in a semiconductor substrate set to the same voltage level as that of said output node and each having a source connected to said output node and a gate to which said control signal is supplied, and a plurality of resistors each of which is connected between drains of said switching MOS transistors, and an end resistor among said plural resistors is connected to said voltage dividing means.

40. A nonvolatile semiconductor memory comprising:

an intermediate voltage generating circuit having first voltage-dividing means for dividing an output voltage from an output node at a predetermined ratio;

a first differential amplifying circuit for receiving a reference voltage and a voltage divided by said first voltage-dividing means;

second voltage-dividing means for dividing the output voltage from said output node at a predetermined ratio;

a second differential amplifying circuit for receiving said reference voltage and voltage divided by said second voltage-dividing means;

a first terminal to which is applied a first voltage;

a first MOS transistor of a first conductive type having a source connected to said first terminal, a drain connected to said output node and a gate to which the output voltage from said first differential amplifying circuit is applied;

a second terminal to which is applied a second voltage; and a second MOS transistor of a second conductive type different than said first type having a source connected to said second terminal, a drain connected to said output node and a gate to which the output voltage from said second differential amplifying circuit is applied; and means for supplying an intermediate voltage generated by said intermediate voltage generating circuit to memory cells in a memory cell array in each of a read mode, a program mode, an erase mode and a verify mode so as to perform the mode.

41. A nonvolatile semiconductor memory according to claim 40, wherein the voltage to be applied to a gate, a source or a drain of said memory cell in said memory cell array in said read mode, said program mode, said erase mode and said verify mode is generated by only said intermediate voltage generating circuit.

42. A nonvolatile semiconductor memory comprising:

an intermediate voltage generating circuit having voltage dividing means for dividing, into a plurality of levels, output voltage from an output node at a predetermined ratio;

a first differential amplifying circuit for receiving a reference voltage and one of voltage levels divided by said voltage-dividing means;

a second differential amplifying circuit for receiving said reference voltage and another voltage level divided by said voltage-dividing means;

a first terminal to which is applied a first voltage;

a first MOS transistor of a first conductive type having a source connected to said first terminal, a drain connected to said output node and a gate to which the output voltage from said first differential amplifying circuit is applied;

a second terminal to which is applied a second voltage;

a second MOS transistor of a second conductive type different than said first conductive type having a source connected to said second terminal, a drain connected to said output node and a gate to which the output voltage from said second differential amplifying circuit is applied; and means for supplying an intermediate voltage generated by said intermediate voltage generating circuit to memory cells in a memory cell array in each of a read mode, a program mode, an erase mode and a verify mode so as to perform the mode.

43. A nonvolatile semiconductor memory according to claim 42, wherein the voltage to be applied to a gate, a source or a drain of said memory cell in said memory cell array in said read mode, said program mode, said erase mode and said verify mode is generated by only said intermediate voltage generating circuit.

44. A nonvolatile semiconductor memory comprising:

an intermediate voltage generating circuit having voltage dividing means for dividing an output voltage from an output node at a predetermined ratio;

a differential amplifying circuit for receiving a reference voltage and a voltage divided by said voltage dividing means;

a first terminal to which is applied a second voltage;

a first MOS transistor having a source connected to said first terminal, a drain connected to said output node and a gate to which the output voltage from said differential amplifying circuit is applied; and a second MOS transistor having a size smaller than that of said first MOS transistor and provided with a source connected to said first terminal, and a gate and a drain which are connected to said gate of said first MOS transistor; and means for supplying an intermediate voltage generated by said intermediate voltage generating circuit to memory cells in a memory cell array in each of a read mode, a program mode, an erase mode and a verify mode so as to perform the mode.

45. A nonvolatile semiconductor memory according to claim 44, wherein the voltage to be applied to a gate, a source or a drain of said memory cell in said memory cell array in said read mode, said program mode, said erase mode and said verify mode is generated by only said intermediate voltage generating circuit.

46. A nonvolatile semiconductor memory comprising:

an intermediate voltage generating circuit having voltage dividing means for dividing an output voltage from an output node at a predetermined ratio;

first and second differential amplifying circuits for receiving a reference voltage and a voltage divided by said voltage dividing means;

a first terminal to which is applied a first voltage;

a first MOS transistor having a source connected to said first terminal, a drain connected to said output node and a gate to which the output voltage from said first differential amplifying circuit is applied;

a second terminal to which is applied a second voltage;

a second MOS transistor having a source connected to said second terminal, a drain connected to said output node and a gate to which the output voltage from said second differential amplifying circuit is applied;

a third MOS transistor having a size smaller than that of said first MOS transistor and provided with a source connected to said first terminal and a gate and a drain which are connected to said gate of said first MOS transistor; and a fourth MOS transistor having a size smaller than that of said second MOS transistor and provided with a source connected to said second terminal and a gate and a drain which are connected to said gate of said second MOS transistor; and means for supplying an intermediate voltage generated by said intermediate voltage generating circuit to memory cells in a memory cell array in each of a read mode, a program mode, an erase mode and a verify mode so as to perform the mode.

47. A nonvolatile semiconductor memory according to claim 46, wherein the voltage to be applied to a gate, a source or a drain of said memory cell in said memory cell array in said read mode, said program mode, said erase mode and said verify mode is generated by only said intermediate voltage generating circuit.

48. A nonvolatile semiconductor memory comprising:

an intermediate voltage generating circuit having voltage dividing means for dividing an output voltage from an output node at a predetermined ratio;

a differential amplifying circuit for receiving a reference voltage and a voltage divided by said voltage-dividing means;

a first terminal to which is applied a first voltage;

a second terminal to which is applied a second voltage;

a first MOS transistor having a source connected to said first terminal and a drain connected to said output node;

a second MOS transistor having a size smaller than that of said first MOS transistor and provided with a source connected to said first terminal and a gate and a drain which are connected to said gate of said first MOS transistor; and a third MOS transistor having a size smaller than that of said first MOS transistor and provided with a source connected to said second terminal, a drain connected to said gate of said first MOS transistor and a gate to which the output voltage from said differential amplifying circuit is applied; and means for supplying an intermediate voltage generated by said intermediate voltage generating circuit to memory cells in a memory cell array in each of a read mode, a program mode, an erase mode and a verify mode so as to perform the mode.

49. A nonvolatile semiconductor memory according to claim 48, wherein the voltage to be applied to a gate, a source or a drain of said memory cell in said memory cell array in said read mode, said program mode, said erase mode and said verify mode is generated by only said intermediate voltage generating circuit.

50. A nonvolatile semiconductor memory comprising:

an intermediate voltage generating circuit having voltage dividing means for dividing an output voltage from an output node at a predetermined ratio;

first and second differential amplified circuits for receiving a reference voltage and a voltage divided by said voltage dividing means;

a first terminal to which is applied a first voltage;

a first MOS transistor having a source connected to said first terminal and a drain connected to said output node;

a second terminal to which is applied a second voltage;

a second MOS transistor having a source connected to said second terminal and a drain connected to said output node;

a third MOS transistor having a size smaller than that of said first MOS transistor and provided with a source connected to said first terminal and a gate and a drain which are connected to said gate of said first MOS transistor;

a fourth MOS transistor having size smaller than that of said first MOS transistor and provided with a source connected to said second terminal, a drain connected to said gate of said first MOS transistor and a gate to which the output voltage from said first differential amplifying circuit is applied; and a fifth MOS transistor having a size smaller than that of said second MOS transistor and provided with a source connected to said second terminal and a gate and a drain which are connected to said gate of said second MOS transistor; and means for supplying an intermediate voltage generated by said intermediate voltage generating circuit to memory cells in a memory cell array in each of a read mode, a program mode, an erase mode and a verify mode so as to perform the mode.

51. A nonvolatile semiconductor memory according to claim 50, wherein the voltage to be applied to a gate, a source or a drain of said memory cell in said memory cell array in said read mode, said program mode, said erase mode and said verify mode is generated by only said intermediate voltage generating circuit.

* * * * *